United States Patent
Sonoyama et al.

(10) Patent No.: US 8,846,426 B2
(45) Date of Patent: Sep. 30, 2014

(54) ORGANIC EL DEVICE AND MANUFACTURING METHOD THEREOF, AND ELECTRONIC APPARATUS

(75) Inventors: Takuya Sonoyama, Fujimi-machi (JP); Toshihiro Oda, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 145 days.

(21) Appl. No.: 13/445,322

(22) Filed: Apr. 12, 2012

(65) Prior Publication Data

US 2012/0261683 A1    Oct. 18, 2012

(30) Foreign Application Priority Data

Apr. 18, 2011  (JP) .................. 2011-091801

(51) Int. Cl.
- H01L 21/00 (2006.01)
- H01L 27/32 (2006.01)
- H01L 51/50 (2006.01)

(52) U.S. Cl.
CPC .......... H01L 27/3211 (2013.01); H01L 51/504 (2013.01)
USPC .............................. 438/35; 257/40; 257/89

(58) Field of Classification Search
USPC .......... 257/40, 59, 70, 72, 88, 89; 438/21, 22, 438/28, 29, 455, 608, 708, 35
See application file for complete search history.

(56) References Cited

U.S. PATENT DOCUMENTS

| | | | |
|---|---|---|---|
| 6,863,961 B2 | 3/2005 | Miyashita et al. | |
| 7,420,203 B2 | 9/2008 | Tsutsui et al. | |
| 7,473,923 B2 | 1/2009 | Tsutsui et al. | |
| 7,942,715 B2 | 5/2011 | Ishihara et al. | |
| 7,956,349 B2 | 6/2011 | Tsutsui et al. | |
| 7,956,353 B2 | 6/2011 | Tsutsui et al. | |
| 8,044,571 B2 | 10/2011 | Liu | |
| 8,581,297 B2 * | 11/2013 | Obana et al. | 257/103 |
| 2007/0190356 A1 | 8/2007 | Arakane et al. | |
| 2008/0286566 A1 | 11/2008 | Prakash | |
| 2011/0227119 A1 | 9/2011 | Tsutsui et al. | |
| 2011/0227125 A1 | 9/2011 | Tsutsui et al. | |

FOREIGN PATENT DOCUMENTS

| | | |
|---|---|---|
| JP | A-2000-208254 | 7/2000 |
| JP | A-2002-056976 | 2/2002 |
| JP | A-2002-208481 | 7/2002 |
| JP | A-2005-071929 | 3/2005 |
| JP | A-2005-123208 | 5/2005 |
| JP | A-2006-269161 | 10/2006 |
| JP | A-2007-073532 | 3/2007 |
| JP | A-2009-016298 | 1/2009 |

(Continued)

*Primary Examiner* — Errol Fernandes
(74) *Attorney, Agent, or Firm* — Oliff PLC

(57) ABSTRACT

An organic EL device includes light emitting functional layers as a first layer with a function of emitting light of a first color which are provided between anodes and a cathode, a light emitting functional layer as a second layer with a function of emitting light of a second color, first light emitting elements that include an intermediate layer as a third layer which is provided between the light emitting functional layers and that emits light of the first color, and a second light emitting element that includes the light emitting functional layer that is provided between the anode and the common cathode, wherein the light emitting functional layers and the intermediate layer are formed using a liquid phase process, the light emitting functional layer is formed using a gaseous phase process, and the intermediate layer is composed of an organic material in which an electron injection material is dispersed.

6 Claims, 7 Drawing Sheets

(56) References Cited

FOREIGN PATENT DOCUMENTS

| | | |
|---|---|---|
| JP | A-2009-520321 | 5/2009 |
| JP | A-2010-528426 | 8/2010 |
| WO | WO 2005/089027 A1 | 9/2005 |
| WO | WO 2007/070529 A2 | 6/2007 |
| WO | WO 2008/144461 A1 | 11/2008 |

* cited by examiner

FIG. 7

| | EXAMPLE 1 | EXAMPLE 2 | COMPARATIVE EXAMPLE 1 | COMPARATIVE EXAMPLE 2 |
|---|---|---|---|---|
| FIRST LAYER (5R, 5G) | ○ | ◎ | × | △ |
| SECOND LAYER (5B) | ○ | ◎ | ◎ | ○ |
| ELEMENT CHARACTERISTIC TOTAL EVALUATION | ○ | ◎ | × | △ |

ORGANIC EL DEVICE AND MANUFACTURING METHOD THEREOF, AND ELECTRONIC APPARATUS

BACKGROUND

1. Technical Field

The present invention relates to an organic EL device and a manufacturing method thereof, and an electronic apparatus.

2. Related Art

An organic EL device in which a red light emitting layer and a green light emitting layer that an organic EL element that emits light in each color includes are formed by an application method and a blue light emitting layer is formed by a vacuum deposition method (deposition method) has been proposed (for example, refer to JP-A-2007-73532).

Although an organic EL element that emits red or green light which is created using an application method such as an ink jet method has a light emitting life (brightness life) or a light emitting efficiency (current efficiency or external quantum efficiency) at a practical level, an organic EL element that emits blue light often does not have a light emitting life or a light emitting efficiency at a practical level.

On the other hand, an organic EL element that emits blue light which is created using a vacuum deposition method has a light emitting life that is several times the length of one that is created using an application method, and is at a practical level. That is, even in a case when the organic EL element of a certain light emitting color which is created using a liquid phase process such as an ink jet method does not have a light emitting life or a light emitting efficiency at a practical level, there is a case when an organic EL element of the same light emitting color which is created using a gaseous phase process such as a vacuum deposition method has a light emitting life or a light emitting efficiency at a practical level.

According to such an organic EL device, a red organic EL element (red pixels) and a green organic EL element (green pixels) respectively have a configuration in which a blue light emitting layer is formed using a vacuum deposition method on a red light emitting layer and a green light emitting layer that the red organic EL element and the green organic EL element include, that is, a configuration in which the blue light emitting layer is formed by a vacuum deposition method over the entire face that includes the red light emitting layer and the green light emitting layer. Therefore, since a manufacturing method of an organic EL device with such a configuration does not need to selectively deposit (form) the blue light emitting layer only on a blue organic EL element (blue pixels) using a high definition mask, such a manufacturing method is optimal for the manufacture of large organic EL devices.

Since the organic EL device of JP-A-2007-73532 has the blue light emitting layer that is respectively provided to be in contact with the red light emitting layer and the green light emitting layer on a red organic EL element and a green organic EL element, there is often a case when electrons are not sufficiently injected into the red light emitting layer and the green light emitting layer from the blue light emitting layer.

Therefore, an unintended blue light emitting layer may emit light for the red organic EL element (red pixels) and the green organic EL element (green pixels), and the purity of colors as red and green, respectively, may decrease.

That is, for an organic EL element that includes a plurality of layers with light emitting functions (light emitting functional layers) between a cathode and an anode, there was a problem that it was difficult to realize an organic EL device that selectively or dominantly causes the required layer out of the light emitting functional layers to emit light.

SUMMARY

The invention can be realized in the following forms or application examples.

Application Example 1

An organic EL device according to the present application example includes: a first light emitting element that includes a first layer that includes the function of emitting light of a first color which is provided between a first anode and a common cathode and a second layer that includes the function of emitting light of a second color, and a third layer that is provided between the first layer and the second layer, and that emits light of the first color; and a second light emitting element that includes the second layer that is provided between a second anode and the common cathode, and that emits light of the second color, wherein the first layer and the third layer are formed using a liquid phase process, the second layer is formed using a gaseous phase process, and the third layer is composed of an organic material in which an electron injection material is dispersed.

According to the present application example, in the first light emitting element, since the third layer that is provided between the first layer and the second layer is an organic material in which an electron injection material is dispersed, the emission of light of the first color by the first layer can be selectively or dominantly performed compared to the emission of light of the second color by the second layer. That is, it is possible to provide an organic EL device that causes the required layer of the first light emitting element and the second light emitting element to selectively or dominantly emit light.

Further, since the third layer is composed of an organic material in which an electron injection material is dispersed and the electron injection material agglomerates less easily than in a case when the third layer is composed of the electron injection material alone, stable carrier control is possible.

Application Example 2

An organic EL device according to the present application example includes: a first light emitting element that includes a first layer that includes the function of emitting light of a first color which is provided between a first anode and a common cathode and a second layer that includes the function of emitting light of a second color, and a third layer that is provided between the first layer and the second layer, and that emits light of the first color; and a second light emitting element that includes the second layer that is provided between a second anode and the common cathode and the third layer that is provided between the second anode and the second layer, and that emits light of the second color, wherein the first layer and the third layer are formed using a liquid phase process, the second layer is formed using a gaseous phase process, and the third layer is composed of an organic material in which an electron injection material is dispersed.

According to the present application example, in addition to being able to cause the first layer of the first light emitting element to selectively or dominantly emit light, since the third layer composed of an organic material in which an electron injection material is dispersed is provided between the second anode and the second layer of the second light emitting element, there is a function by which the carrier is held in the second layer, improving the light emitting efficiency.

Further, since the third layer is composed of an organic material in which an electron injection material is dispersed and the electron injection material agglomerates less easily than in a case when the third layer is composed of the electron injection material alone, stable carrier control is possible.

Application Example 3

With the organic EL devices according to the application examples described above, it is preferable that a first hole transport layer that is provided between the first anode and the first layer and between the second anode and the second layer, and a second hole transport layer that is provided between the third layer and the second layer be provided.

In so doing, holes are efficiently transported from the first hole transport layer to the first layer of the first light emitting element, and holes are efficiently transported from the second hole transport layer from the second layer of the second light emitting element. It is therefore possible to further increase the light emitting efficiency of the first light emitting element and the second light emitting element.

Application Example 4

With the organic EL devices according to the application examples described above, it is preferable that the first layer and the third layer be laminated by being in contact.

In so doing, the function of injecting electrons from the third layer into the first layer can be strengthened further.

Application Example 5

With the organic EL devices according to the application examples described above, it is preferable that the electron injection material be configured by an alkali metal, an alkaline earth metal, or a compound thereof.

In so doing, since the third layer is composed of an organic material in which an alkali metal, an alkaline earth metal, or a compound thereof is dispersed, the injection property of electrons from at least the third layer to the first layer can be improved.

Application Example 6

With the organic EL devices according to the application examples described above, it is preferable that the organic material be a water-soluble high-molecular compound.

In so doing, the electron injection material is evenly dispersed within the organic material in the third layer, thus making stable carrier control possible. Further, the formation of the third layer becomes easy by using a high-molecular compound.

Application Example 7

With the organic EL devices according to the application examples described above, it is preferable that the organic material be a water-soluble low-molecular compound.

In so doing, the electron injection material is evenly dispersed within the organic material in the third layer, thus making stable carrier control possible. Further, by using a low-molecular compound, the third layer with the required thickness can be formed at the required position using a liquid ejection method such as, for example, an ink jet method.

Application Example 8

With the organic EL devices according to the application examples described above, it is preferable that the first color be red or green and the second color is blue.

In so doing, it is possible to provide an organic EL device by which full color light emission is obtained.

Application Example 9

A manufacturing method of an organic EL device according to the present application example includes: respectively forming a first hole transport layer on a first anode and a second anode; forming a first layer that includes the function of emitting light of a first color on the first hole transport layer of the first anode side using a liquid phase process; forming a third layer composed of an organic material in which an electron injection material is dispersed on the first layer using a liquid phase process; forming a second layer that includes the function of emitting light of a second color on the third layer and on the first hole transport layer of the second anode side using a maskless gas phase process; and forming a common cathode on the second layer.

According to the present application example, since the third layer that is formed between the first layer and the second layer is an organic material in which an electric injection material is dispersed, the emission of light of the first color by the first layer can be selectively or dominantly performed compared to the emission of light of the second color by the second layer. That is, it is possible to manufacture an organic EL device that causes the required layer to selectively or dominantly emit light between the first and second anodes and the common cathode.

Further, since a liquid phase process is used in the formation of the first layer and the third layer and a maskless gaseous phase process is used in the formation of the second layer, it is possible to manufacture an organic EL device that includes a plurality of light emitting elements by which different light emission colors are obtained while securing high productivity.

Further, since the third layer is formed using an organic material in which an electron injection material is dispersed and the electron injection material agglomerates less easily than in a case when the third layer is composed of the electron injection material alone, stable carrier control is possible.

Application Example 10

A manufacturing method of an organic EL device according to the present application example includes: respectively forming a first hole transport layer on a first anode and a second anode; forming a first layer that includes the function of emitting light of a first color on the first hole transport layer of the first anode side using a liquid phase process; forming a third layer composed of an organic material in which an electron injection material is dispersed on the first layer and the first hole transport layer of the second anode side using a liquid phase process; forming a second layer that includes the function of emitting light of a second color on the third layer using a maskless gas phase process; and forming a common cathode on the second layer.

According to the present application example, in addition to being able to cause the first layer to selectively or dominantly emit light between the first anode and the common cathode and being able to manufacture an organic EL device that includes a plurality of light emitting elements while securing high productivity, since the third layer composed of an organic material in which an electron injection material is dispersed is provided between the second anode and the second layer between the second anode and the common cathode, it is possible to provide a manufacturing method of an organic EL device with which there is a function by which the carrier is held in the second layer, improving the light emitting efficiency in the second layer.

Further, since the third layer is formed using an organic material in which an electron injection material is dispersed and the electron injection material agglomerates less easily than in a case when the third layer is composed of the electron injection material alone, stable carrier control is possible.

Application Example 11

It is preferable that the manufacturing methods of an organic EL device according to the application examples described above include forming a second hole transport layer between the third layer and the second layer.

According to such a method, since not only holes are efficiently transported from the first hole transport layer to the first layer, but holes are efficiently transported from the second hole transport layer to the second layer between the second anode and the common cathode, the light emitting efficiency of the first layer and the second layer is improved further.

Application Example 12

It is preferable that the manufacturing methods of an organic EL device according to the application examples described above include configuring the electron injection material by an alkali metal, an alkaline earth metal, or a compound thereof.

According to such a method, since the third layer is formed using an organic material in which an alkali metal, an alkaline earth metal, or a compound thereof is dispersed, the injection property of electrons from at least the third layer to the first layer can be improved.

Application Example 13

According to the manufacturing method of an organic EL device according to the application examples described above, it is preferable that the organic material be a water-soluble high-molecular compound.

According to such a method, since a high-molecular compound by which the electron injection material is evenly dispersed is used when forming the third layer, it is possible to manufacture an organic EL device with which stable carrier control is possible. Further, since a high-molecular compound is used, formation of the third layer becomes easy.

Application Example 14

According to the manufacturing method of an organic EL device according to the application examples described above, it is preferable that the organic material be a water-soluble low-molecular compound.

According to such a method, since a low-molecular compound by which the electron injection material is evenly dispersed is used when forming the third layer, it is possible to manufacture an organic EL device with which more stable carrier control is possible. Further, since a low-molecular compound is used, it is possible to form the third layer of the desired thickness at the desired portion using a liquid ejection method such as, for example, an ink jet method as the liquid-phase process.

Application Example 15

An electronic apparatus of the present application example includes the organic EL devices in the application examples described above.

According to such a configuration, along with it being possible to cause the desired layer of the first light emitting element and the second light emitting element to selectively or dominantly emit light, since the first layer and the third layer are formed using a liquid phase process and the second layer includes an organic EL device that can be formed using a maskless gaseous phase process, it is possible to provide a well-presented and high-cost-performance electronic apparatus.

BRIEF DESCRIPTION OF THE DRAWINGS

The invention will be described with reference to the accompanying drawings, wherein like numbers reference like elements.

FIG. 7 is a table that illustrates the overall evaluation results of the light emitting state and the element characteristics of the light emitting elements in the examples and comparative examples.

DESCRIPTION OF EXEMPLARY EMBODIMENTS

An organic EL device and a manufacturing method thereof, and an electronic apparatus of the invention will be described below using the preferable embodiments illustrated in the attached drawings. Here, the light emitting efficiency in the embodiments, examples, and comparative examples refer to the current efficiency or the external quantum efficiency.

First Embodiment

Organic EL Device

Figure 1:
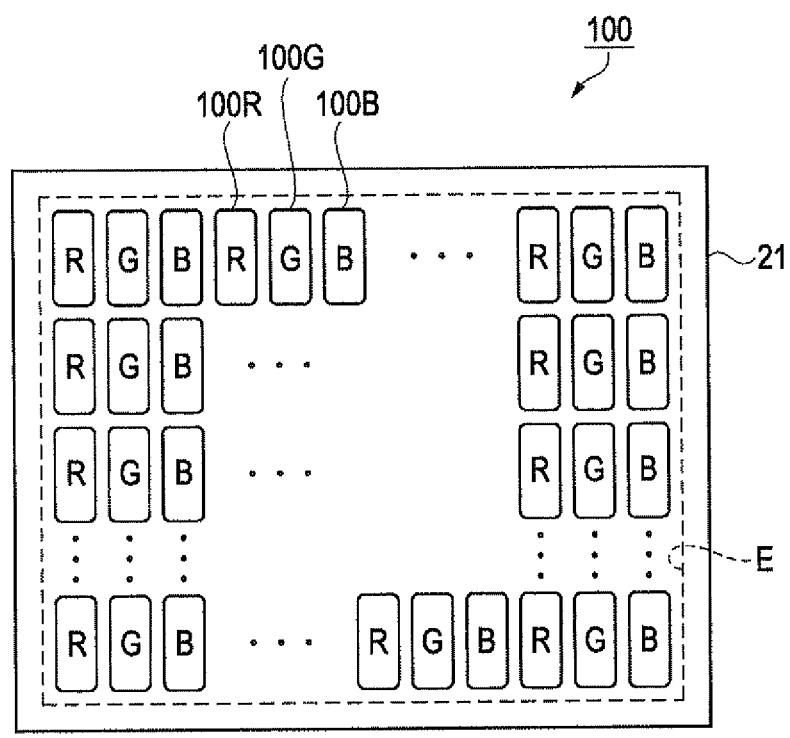
FIG. 1 is an outline plan view that illustrates the configuration of an organic EL device of a first embodiment.

First, an organic EL device that includes light emitting elements of the invention will be described with reference to FIGS. 1 to 3. FIG. 1 is an outline plan diagram that illustrates the configuration of an organic EL device of a first embodiment, FIG. 2 is an outline cross-sectional diagram that illustrates the structure of the organic EL device of the first embodiment, and FIG. 3 is a schematic diagram that illustrates the configuration of light emitting elements of the organic EL device of the first embodiment.

As illustrated in FIG. 1, an organic EL device 100 of the present embodiment includes subpixels 100R, 100G, and 100E with which light emission (light emitting color) of red (R), green (G), and blue (B) is obtained. Each subpixel 100R, 100G, and 100E is substantially rectangular, and is arranged in a matrix pattern in a display region E. Subpixels by which light of the same color is emitted are arranged in the vertical direction in the drawing (the column direction or the longitudinal direction of the light emitting pixels), and subpixels of different light emitting colors are arranged in order of R, G, and B in the horizontal direction in the drawing (the row direction or the transverse direction of the light emitting pixels). That is, the subpixels 100R, 100G, and 100B of different light emitting colors are arranged in a so-called stripe form. Here, the shapes and arrangements of the subpixels 100R, 100G, and 100B of different light emitting colors in plan view are not limited thereto.

If such an organic EL device 100 is to be used as a display device, the respective subpixels 100R, 100G, and 100B are electrically controlled with the three subpixels 100R, 100G, and 100B by which different light emitting colors are obtained as one display pixel unit. In so doing, a full color display is possible.

Figure 2:
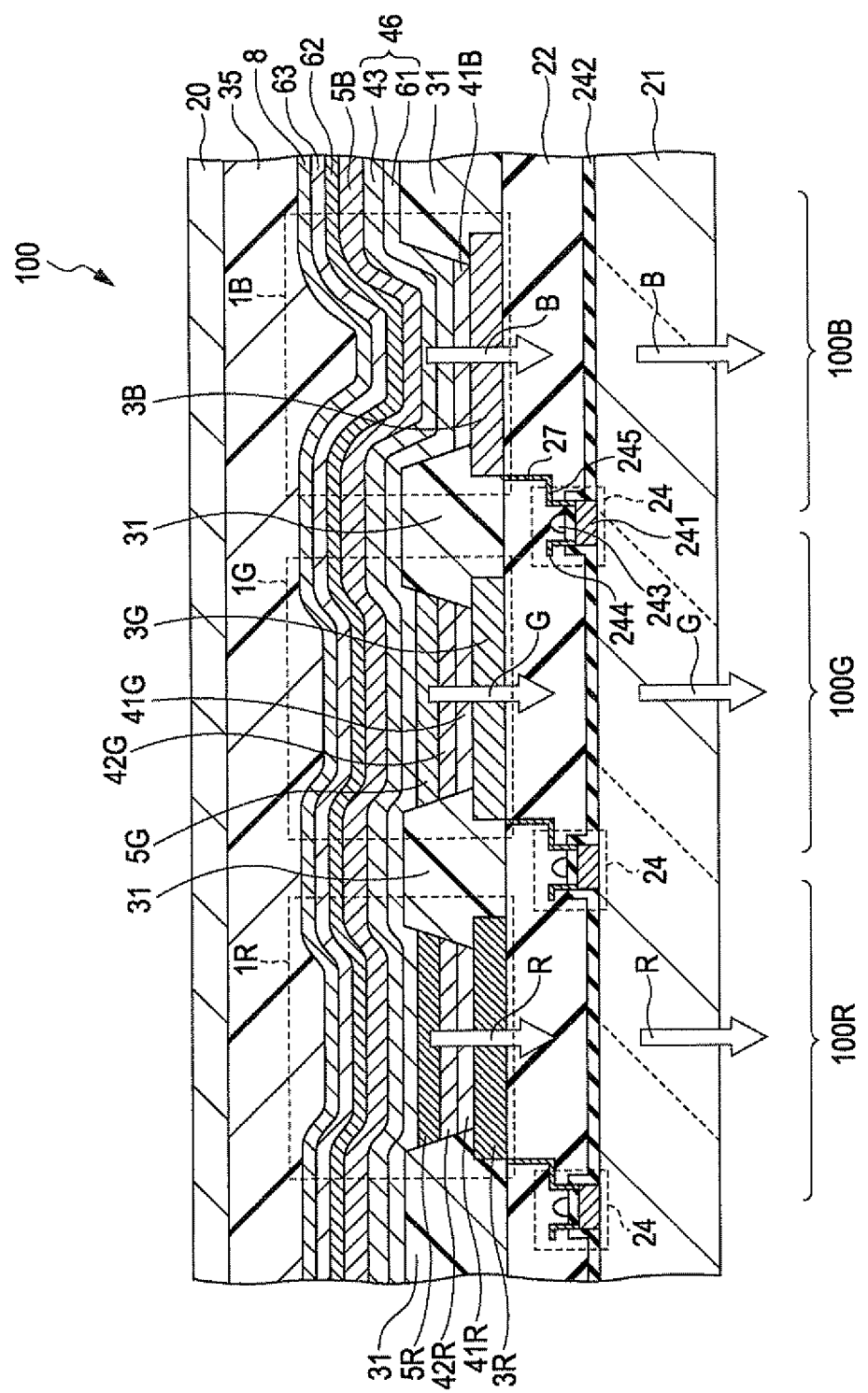
FIG. 2 is an outline cross-sectional diagram that illustrates the structure of the organic EL device of the first embodiment.
Figure 3:
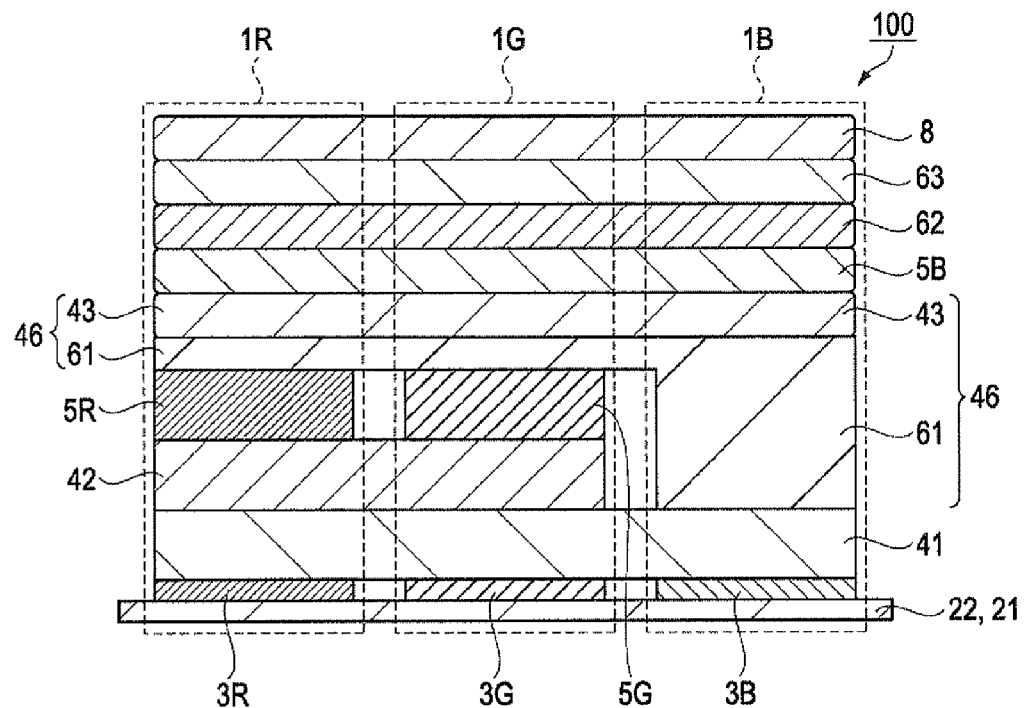
FIG. 3 is a schematic diagram that illustrates the configuration of light emitting elements of the organic EL device of the first embodiment.

As illustrated in FIG. 2, the organic EL device 100 includes a substrate 21, a plurality of light emitting elements (organic EL elements) 1R, 1G, and 1B that are provided to correspond with the subpixels 100R, 100G, and 100B on the substrate 21, and a plurality of driving transistors 24 for respectively driving each of the light emitting elements 1R, 1G, and 1B.

Here, according to the present embodiment, the organic EL device 100 is a display panel of a bottom emission structure in which light R, G, and B from each of the light emitting elements 1R, 1G, and 1B is emitted from the substrate 21 side.

The plurality of driving transistors 24 are provided on the substrate 21, and a flattening layer 22 that is configured by an insulating material is formed to cover the driving transistors 24.

Each of the driving transistors 24 includes a semiconductor 241 composed of a semiconductor material such as silicon, a gate insulating layer 242 that is formed on a semiconductor layer 241, a gate electrode 243 that is formed on the gate insulating layer 242, a source electrode 244, and a drain electrode 245.

Further, the light emitting elements 1R, 1G, and 1B are provided on the flattening layer 22 to correspond with each of the driving transistors 24.

Light emitting functional layers 5R, 5G, and 5B by which light emission of different colors (R, G, and B) is obtained are included between anodes 3R, 3G, and 3B and a common cathode 8. The light emitting functional layer 5R, 5G, and 5B may be referred to as a red light emitting functional layer 5R, a green light emitting functional layer 5G, and a blue light emitting functional layer 5B to correspond to the respective light emitting colors.

According to the present embodiment, the light emitting element 1R and the light emitting element 1G correspond to the first light emitting element, and the light emitting element 1B corresponds to the second light emitting element.

Therefore, an anode 3R and an anode 3G correspond to the first anode, and an anode 3B corresponds to the second anode. Further, the red light emitting functional layer 5R and the green light emitting functional layer 5G correspond to the first layer, and are formed using a liquid phase process such as an ink jet method, for example. The blue light emitting functional layer 5B corresponds to the second layer, and is formed to straddle the three light emitting elements 1R, 1G, and 1B using a gaseous phase process such as a vacuum deposition method, for example. Specifically, with the light emitting element 1R, the blue light emitting functional layer 5B is formed between the red light emitting functional layer 5R and the common cathode 8. With the light emitting element 1G, the blue light emitting functional layer 5B is formed between the green light emitting functional layer 5G and the common cathode 8. With the light emitting element 1B, the blue light emitting function 58 is formed between the anode 3B and the common cathode 8.

Further, the light emitting elements 1R, 1G, and 1B include a carrier selection layer 46 between the respective anodes 3R, 3G, and 3B and the blue light emitting functional layer 5B. The carrier selection layer 46 is a layer with a function in which the flow of carriers (referring to electrons and holes) is selected by a function of a functional layer with which the carrier selection layer 46 is in contact on the anode 3R, 3G, and 3B side. According to the present embodiment, the carrier selection layer 46 is configured by a laminated body in which an intermediate layer 61 and a second hole transport layer 43 as the third layer are laminated in order from the anode 3R, 3G, and 3B side. Although details will be described later, the intermediate layer 61 is composed of an organic material in which an electron injection material is dispersed.

With the light emitting element 1R, the carrier selection layer 46 is provided between the red light emitting functional layer 5R and the blue light emitting functional layer 5B. With the light emitting element 1G, the carrier selection layer 46 is provided between the green light emitting functional layer 5G and the blue light emitting functional layer 5B. Further, with the light emitting element 1B, the carrier selection layer 46 is provided between the blue light emitting functional layer 5B and a hole injection layer 41B.

More specifically, as illustrated in FIG. 3, with the light emitting element 1R, the anode 3R, a hole injection layer 41, a first hole transport layer 42, the red light emitting functional layer 5R as the first layer, the intermediate layer 61, a second hole transport layer 43, the blue light emitting functional layer 5B as the second layer, an electron transport layer 62, an electron injection layer 63, and the common cathode 8 are laminated in such an order on the flattening layer 22.

Further, with the light emitting element 1G, the anode 30, the hole injection layer 41, the first hole transport layer 42, the green light emitting functional layer 50 as the first layer, the intermediate layer 61, the second hole transport layer 43, the blue light emitting functional layer 5B as the second layer, the electron transport layer 62, the electron injection layer 63, and the common cathode 8 are laminated in such an order on the flattening layer 22.

Further, with the light emitting element 1B, the anode 3B, the hole injection layer 41, the intermediate layer 61, the second hole transport layer 43, the blue light emitting functional layer 5B as the second layer, the electron transport layer 62, the electron injection layer 63, and the common cathode 8 are laminated on the flattening layer 22.

A bulkhead 31 (refer to FIG. 2) is provided between each of the adjacent light emitting elements 1R, 1G, and 1B with such configurations, and in so doing, each of the light emitting elements 1R, 1G, and 1B are provided individually.

According to the present embodiment, with each of the light emitting elements 1R, 1G, and 1B, each of the anodes 3R, 3G, and 3B, each of the hole injection layers 41R, 41G, and 41B, each of the first hole transport layers 42R and 42G, and each of the light emitting functional layers 5R and 5G are provided by being divided by the bulkhead 31, and the intermediate layer 61, the second hole transport layer 43, the blue light emitting functional layer 5B, the electron transport layer 62, the electron injection layer 63, and the common cathode 8 are integrally provided. By such a configuration, each of the anodes 3R, 3G, and 3B of each of the light emitting elements 1R, 1G, and 1B configure pixel electrodes (individual electrodes), and furthermore, the common cathode 8 of each of the light emitting elements 1R, 1G, and 1B configures a shared electrode. Further, each of the anodes 3R, 3G, and 3B of each of the light emitting elements 1R, 1G, and 1B are electrically connected to the drain electrode 245 of each of the driving transistors 24 by a conductive portion (wiring) 27 (refer to FIG. 2).

By controlling the light emission brightness of each of the light emitting elements 1R, 1G, and 1B of the organic EL device 100 that includes the light emitting elements 1R, 1G, and 1B using the driving transistors 24 in such a manner, full color display of the organic EL device 100 is possible. Details of each of the light emitting elements 1R, 1G, and 1B will be described later.

According to the present embodiment, as illustrated in FIG. 2, an epoxy layer 35 that is configured by an epoxy resin is formed to cover the light emitting elements 1R, 1G, and 1B. Furthermore, a sealing substrate 20 is provided to cover the epoxy layer 35. In so doing, since the airtightness of the light emitting elements 1R, 1G, and 1B is secured and the infiltration of oxygen or moisture can be prevented, the reliability of the light emitting elements 1R, 1G, and 1B can be improved.

The organic EL device 100 described above is capable of single color display by causing each of the light emitting elements 1R, 1G, and 1B to selectively emit light, and is also capable of full color display by causing each of the light emitting elements 1R, 1G, and 1B to emit light in combination.

Each of the light emitting elements 1R, 1G, and 1B will be sequentially described below.

Light Emitting Element 1R

The light emitting element (red light emitting element) 1R has a laminated body in which the hole injection layer 41, the first hole transport layer 42, the red light emitting functional layer 5R, the carrier selection layer 46, the blue light emitting functional layer 5B, the electron transport layer 62, and the electron injection layer 63 are laminated from the anode 3R side in such an order which is inserted between the anode 3R and the common cathode 8.

With the light emitting element 1R, the carrier selection layer 46 is configured by a laminated body in which the intermediate layer 61 and the second hole transport layer 43 as the third layer are laminated from the anode 3R side in such an order. Further, with the light emitting element 1R, the anode 3R and the common cathode 8 respectively configure individual electrodes and a common electrode, the anode 3R functions as an electrode that injects holes into the hole injection layer 41R, and the common cathode 8 functions as an electrode that injects electrons into the electron transport layer 62 via the electron injection layer 63.

Each of the portions that configure the light emitting element 1R will be successively described below.

Anode 3R

The anode 3R is an electrode that injects holes into the hole injection layer 41.

Although the constituent material of the anode 3R is not particularly limited, a material with a large work function and with excellent conductivity is favorably used.

As the constituent material of the anode 3R, for example, there is ITO (Indium Tin Oxide), IZO (Indium Zinc Oxide), $In_2O_3$, $SnO_2$, fluoridated $SnO_2$, antimony-doped $SnO_2$, ZnO, aluminum-doped ZnO, Ga-doped ZnO, and the like, and one or two or more thereof may be used in combination.

Although the average thickness of such an anode 3R is not particularly limited, approximately equal to or greater than 10 nm and equal to or less than 200 nm is preferable, and approximately equal to or greater than 30 nm and equal to or less than 150 nm is more preferable.

Here, in a case when the organic EL device 100 is a bottom emission structure display panel, since light transmissivity is demanded of the anode 3R, out of the constituent materials described above, a metal oxide with light transmissivity is favorably used.

Hole Injection Layer 41

The hole injection layer 41 has a function of facilitating hole injection from the anode 3R.

Although the constituent material of the hole injection layer 41 (hole injection material) is not particularly limited, an ion conductive hole injection material in which an electron-accepting dopant is added to a conductive high-molecular material (or a conductive oligomer material) is favorably used so that the hole injection layer 41 can be formed using a liquid phase process in the formation process of the hole injection layer 41 described later.

Examples of such an ion conductive hole injection material include a polythiophene-based hole injection material such as poly(3,4-ethylenedioxyl thiophene)-poly(styrenesulfonic acid) (PEDOT/PSS), a polyaniline-based hole injection material such as polyaniline-poly(styrenesulfonic acid) (PATI/PSS), or an oligoaniline-based hole injection material that is composed by forming a salt with the oligoaniline derivative represented by Chemical Formula 1 below and the electron-accepting dopant represented by Chemical Formula 4 below.

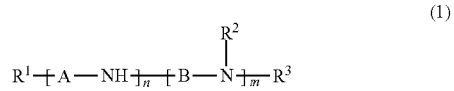
(1)

In the formula, R1, R2, and R3 indicate respectively independent unsubstituted or substituted monovalent hydrocarbon groups or organoxy groups, A and B are respectively independent divalent groups that are represented by Chemical Formula 2 or Chemical Formula 3 below, R4 to R11 are respectively independent hydrogen atoms, hydroxyl groups, unsubstituted or substituted monovalent hydrocarbon groups, organoxy groups, acyl groups, or sulfonic groups, and m and n are respectively independent positive numbers of one or greater, and satisfy m+n≤20.

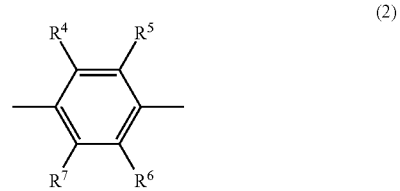
(2)

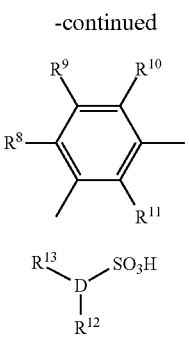

(3)

(4)

In the formula, D represents a benzene ring, a naphthalene ring, an anthracene ring, a phenanthrene ring, or a heterocyclic ring, and R12 and r13 represent respectively independent carboxyl groups or hydroxyl groups.

Although the average thickness of such a hole injection layer 41 is not particularly limited, approximately equal to or greater than 5 nm and equal to or less than 150 nm is preferable, and approximately equal to or greater than 10 nm and equal to or less than 100 nm is more preferable.

Here, the hole injection layer 41R may be omitted depending on the combinations of types, film thicknesses, and the like of the anode 3R, the first hole transport layer 42R, and the red light emitting functional layer 5R that configure the light emitting element 1R.

First Hole Transport Layer 42

The first hole transport layer 42 has a function of transporting the holes that are injected from the hole injection layer 41 to the red light emitting functional layer 5R. Further, there is also a case when the first hole transport layer 42 has a function of blocking electrons that try to pass through from the red light emitting functional layer 5R to the first hole transport layer 42.

Although the constituent material of the first hole transport layer 42 is not particularly limited, an amine-based compound such as, for example, the triphenylamine-based polymer represented by Chemical Formula 5 below is preferably used so that the first hole transport layer 42 can be formed using a liquid phase process in the formation process of the first hole transport layer 42.

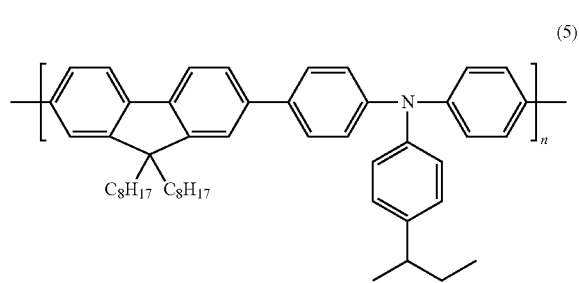

(5)

While the average thickness of such a first hole transport layer 42 is not particularly limited, approximately equal to or greater than 5 nm and equal to or less than 100 nm is preferable, and approximately equal to or greater than 10 nm and approximately equal to or less than 50 nm is more preferable.

Here, the hole transport layer 42 may be omitted depending on the combinations of types, film thicknesses, and the like of the anode 3R, the first hole injection layer 41, the red light emitting functional layer 5R, the intermediate layer 61, the second hole transport layer 43, the blue light emitting functional layer 5B, the electron transport layer 62, the electron injection layer 63, and the common cathode 8 that configure the light emitting element 1R.

Red Light Emitting Functional Layer 5R

The red light emitting functional layer 5R is configured to include a red light emitting material.

With the light emitting element 1R, the red light emitting functional layer 5R configures the first layer that is provided between the anode 3R and the carrier selection layer 46, and the red light emitting functional layer 5R includes a function of causing light of the first color (red) to be emitted by the light emitting element 1R.

Although the constituent material of such a red light emitting functional layer 5R is not particularly limited, it is desirable that the constituent material be dissolved or dispersed in a liquid so that the red light emitting functional layer 5R can be formed using a liquid phase process in the formation process of the red light emitting functional layer 5R. Therefore, a high-molecular red light emitting material and a low-molecular red light emitting material that can be dissolved or dispersed in a solvent or a dispersant are preferably used as the constituent material of the red light emitting functional layer 5R, and for example, is a fluorine derivative high-molecular red light emitting material represented by Chemical Formulae 6 and 7 below.

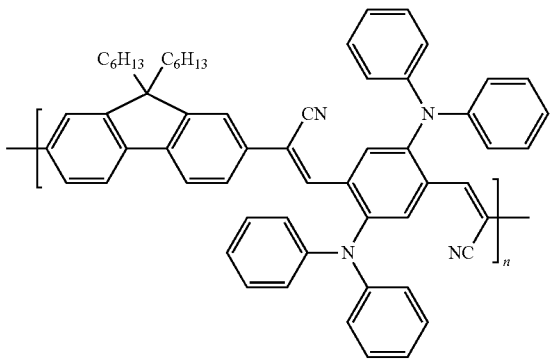

(6)

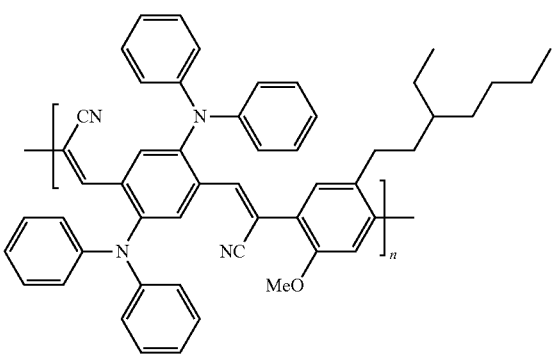

(7)

Here, the light emitting element 1R that includes the red light emitting functional layer 5R that is formed through such a liquid phase process includes sufficient light emitting life characteristics at a practical level.

While the average thickness of such a red light emitting functional layer 5R is not particularly limited, approximately equal to or greater than 10 nm and equal to or less than 150 nm is preferable, and approximately equal to or greater than 20 nm and equal to or less than 100 nm is more preferable.

Carrier Selection Layer 46

The carrier selection layer 46 is configured by a laminated body in which the intermediate layer 61 and the second hole transport layer 43 as the third layer are laminated in such an order from the anode 3R side.

With the light emitting element 1R, the carrier selection layer 46 performs a carrier injection action of smoothly injecting the electrons that flow from the blue light emitting functional layer 5B to the carrier selection layer 46 into the red light emitting functional layer 5R. Therefore, with the light emitting element 1R, the light emission from the blue light emitting functional layer 5B is largely suppressed, and the red light emitting functional layer 5R selectively or dominantly emits light.

Intermediate Layer 61

The intermediate layer 61 is one layer that configures the carrier selection layer 46, is composed of an organic material is which an electron injection material is dispersed, and is formed to be in contact with the red light emitting functional layer 5R.

As the electron injection material that configures the intermediate layer 61, there is an electron injection material such as, for example, an alkali metal, an alkaline earth metal, a precious metal, an alkali metal salt (oxide, fluoride, chloride, or the like), an alkaline earth metal salt (oxide, fluoride, chloride, or the like), a precious metal salt (oxide, fluoride, chloride, or the like), or a metal complex, and one or two or more types thereof may be used in combination.

By forming the intermediate layer 61 using an organic material in which such an electron injection material is dispersed, the injection efficiency of electrons from the blue light emitting functional layer 5B to the red light emitting functional layer 5R can be improved further via the carrier selection layer 46.

Examples of an alkali metal include Li, Na, K, Rb, and Cs. Further, examples of an alkaline earth metal include Mg, Ca, Sr, and Ba. Furthermore, examples of a precious metal include Nd, Sm, Y, Tb, and Eu.

Examples of an alkali metal salt include LiF, $Li_2CO_3$, LiCl, NaF, $Na_2CO_3$, NaCl, CsF, $Cs_2CO_3$, and CsCl. Further, examples of an alkaline earth metal salt include $CaF_2$, $CaCO_3$, $SrF_2$, $SrCO_3$, $BaF_2$, and $BaCO_3$. Furthermore, examples of a precious metal salt include $SmF_3$ and $ErF_3$.

Examples of a metallic complex include an organic metallic complex with 8-quinolinol such as 8-quinolinolato lithium (Liq) and tris(8-quinolinolato)aluminum ($Alq_3$) or a derivative thereof as the ligand.

As an organic material in which the electron injection material is dispersed, for example, a water-soluble high-molecular compound is preferable, and may be PHOT/PSS, PVA, polyvinyl carbazole, polysilane, starch, or cellulose with a hydroxyl group.

Further, it is also possible to use a water-soluble low-molecular compound such as, for example, quinacridone, distyryl biphenyl, a derivative thereof, coumarin and a derivative thereof, tetraphenylbutadiene, or a derivative thereof.

Further, a low-molecular organic material may be dispersed in a high-molecular organic material and the electron injection material may be dispersed or dissolved therein.

A high molecular-weight molecule in an organic material of the present embodiment refers to one with a molecular weight of equal to or greater than 10000, and a low-molecular-weight molecule refers to one with a molecular weight of less than 10000.

Water is preferable as a solvent within which the organic material is dispersed or dissolved, and the solvent may be an alcohol with compatibility with water such as methanol or ethanol, N,N-dimethylformamide (DFM), N-methylpyrrolidone (NMP), dimethyl imidazoline (DMI), or dimethyl sulfoxide (DMSO).

Further, the formation process of the intermediate layer 61 may use a liquid phase process such as a spin coating method, an ink jet method, or a slit coating method.

While the average thickness of the intermediate layer 61 is not particularly limited, approximately equal to or greater than 0.01 and equal to or less than 10 nm is preferable, and approximately equal to or greater than 0.1 nm and equal to or less than 5 nm is more preferable. By setting the average thickness of the intermediate layer 61 to within such a range, the carrier injection action by the carrier selection layer 46 for the light emitting element 1R is performed accurately.

Second Hole Transport Layer 43

The second hole transport layer 43 is one layer that configures the carrier selection layer 46, and is formed to be in contact with the blue light emitting functional layer 5B.

While the constituent material of the second hole transport layer 43 is not particularly limited, examples include amine compounds such as, for example, N,N'-di(m-tolyl)-benzidine (TPD), bis[N-(1-naphthyl)-N-phenyl]benzidine (α-NPD) represented by Chemical Formula 8 below, and a benzidine derivative such as the compound represented by Chemical Formula 9 below so that the second hole transport layer 43 can be formed using a gaseous phase process such as vacuum deposition in the formation process of the second hole transport layer 43 described later, and one or two or more types thereof may be used in combination.

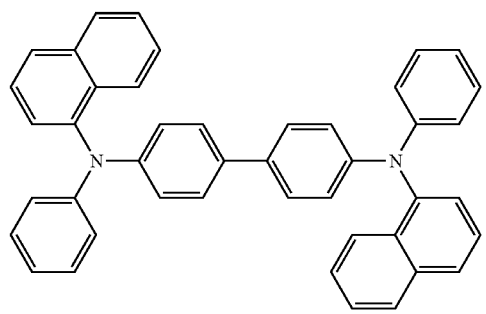

(9)

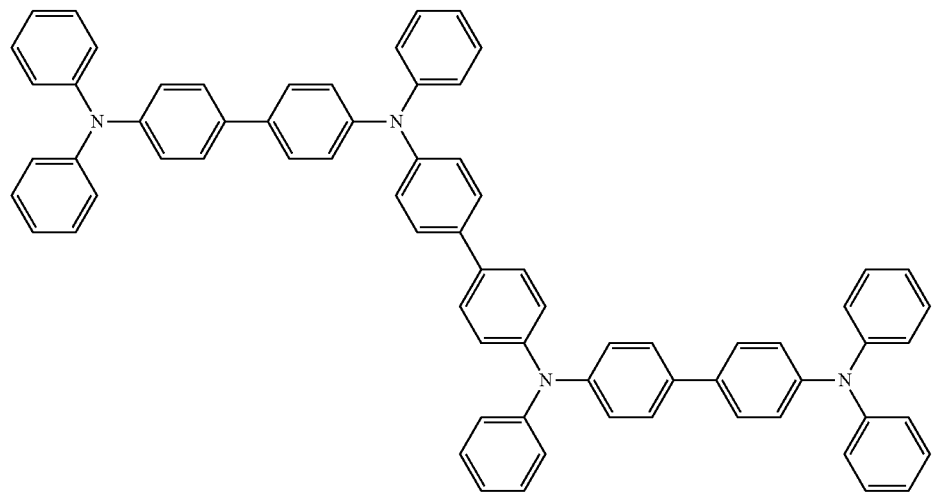

While the average thickness of the second hole transport layer 43 is not particularly limited, approximately equal to or greater than 1 nm and equal to or less than 50 nm is preferable, and approximately equal to or greater than 5 nm and equal to or less than 30 nm is more preferable. By setting the average thickness of the second hole transport layer 43 to within such a range, the carrier injection action by the carrier selection layer 46 for the light emitting element 1R is performed accurately.

Blue Light Emitting Functional Layer 5B

The blue light emitting functional layer 5B is configured to include a blue light emitting material that emits blue light.

According to the present embodiment, the blue light emitting functional layer 5B configures the second layer that is provided between the anodes (3R, 3G, and 3B) and the common cathode 8, and the blue light emitting functional layer 5B has a function of emitting light of the second color (blue).

Although the constituent material of the blue light emitting functional layer 5B is not particularly limited, a constituent material that can be formed using a gaseous phase process in the formation process of the blue light emitting functional layer 5B described later is preferably used, and an example thereof is a blue light emitting material of a styryl derivative represented by Chemical Formula 10 below.

(10)

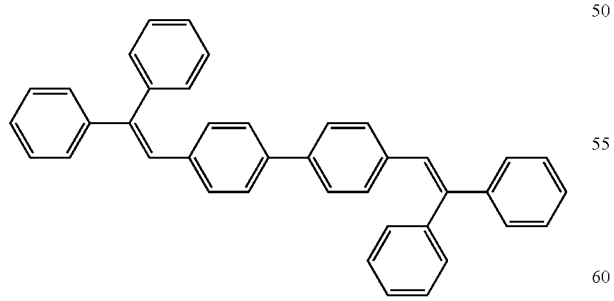

Further, as another constituent material of the blue light emitting functional layer 5B, a material in which the blue light emitting functional material is doped to a host material as a guest material is used. The host material has a function of generating excitons by recoupling holes and electrons, as well as of transferring the energy of the excitons to the blue light emitting material (Förster transfer or Dexter transfer). By such a function of the host material, the blue light emitting material that is the guest material is efficiently excited and emits light.

Here, examples of the host material include the anthracene derivatives represented by Chemical Formulae 11, 12, and 13 below, and one or two or more types thereof may be used in combination. Further, examples of the blue light emitting material as the guest material include the styryl derivatives represented by Chemical Formulae 14, 15, and 16 below, and one or two or more types thereof may be used in combination.

(11)

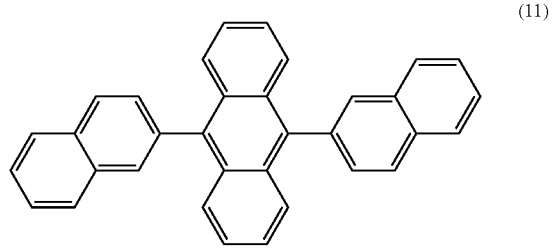

(12)

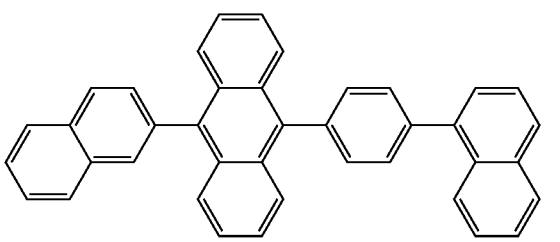

(13)

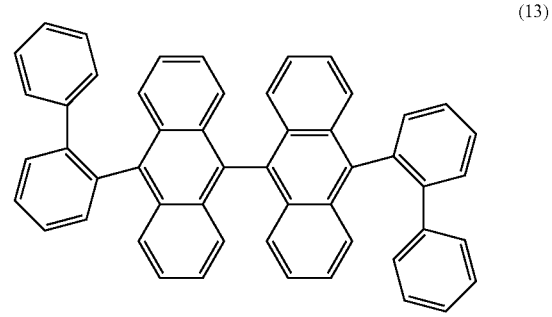

-continued

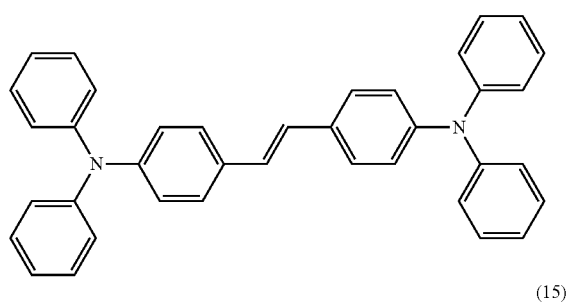
(14)

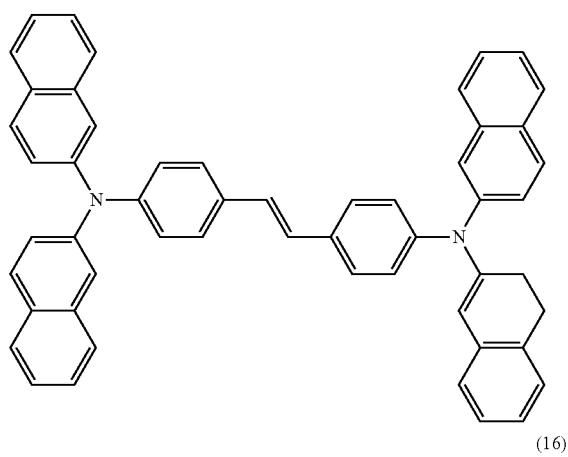
(15)

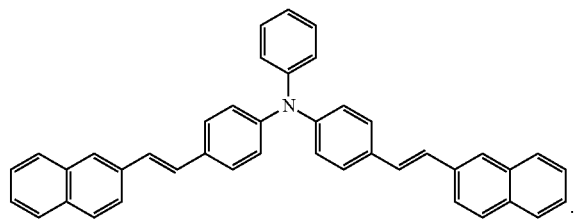
(16)

Here, the light emitting element 1B as the second light emitting element that includes the blue light emitting functional layer 5B that is formed through such a gaseous phase process has sufficient light emitting life characteristics at a practical level.

Furthermore, in a case when such a guest material and host material are used, the content amount (doping amount) of the guest material in the blue light emitting functional layer 5B is preferably approximately equal to or greater than 0.1% and equal to or less than 20% by weight with respect to the host material, and approximately equal to or greater than 0.5% and equal to or less than 10% is more preferable. By setting the content amount of the guest material within such a region, the light emitting efficiency can be optimized.

While the average thickness of such a blue light emitting functional layer 5B is not particularly limited, approximately equal to or greater than 5 nm and equal to or less than 100 nm is preferable, and approximately equal to or greater than 10 nm and equal to or less than 50 nm is more preferable.

Electron Transport Layer 62

The electron transport layer 62 has a function of transporting the electrons that are injected from the common cathode 8 into the electron transfer layer 62 via the electron injection layer 63 to the blue light emitting functional layer 5B. Further, there may be a case when the electron transport layer 62 has a function of blocking the holes that try to pass through from the blue light emitting functional layer 5B to the electron transport layer 62.

Although the constituent material of the electron transport layer 62 (electron transport material) is not particularly limited, in order that the electron transport layer 62 be able to be formed using a gaseous phase process in the formation process of the electron transport layer 62 described later, a quinoline derivative such as an organic metallic complex in which 8-quinolinol such as, for example, tris(8-quinolinolato)aluminum ($Alq_3$) or 8-quinolinolato lithium (Liq) or a derivative thereof is the ligand, an oxadiazole derivative such as 2-(4-tert-butyl phenyl)-5-(4-biphenyl)-1,3,4-oxadiazole (tBu-PBD) or 2,5-bis(1-naphthyl)-1,3,4-oxadiazole (BND), a triazole derivative such as 3-(4-biphenyl)-4-phenyl-5-(4-cert-butyl phenyl)-1,2,4-triazole (TAZ), a silole derivative such as the compound represented by Chemical Formula 17 below, a pyridine derivative, a pyrimidine derivative, a quinoxaline derivative, or a nitrogen-containing heterocyclic derivative or the like such as the compound represented by Chemical Formula 18 below is preferably used, and one or two or more types thereof may be used in combination.

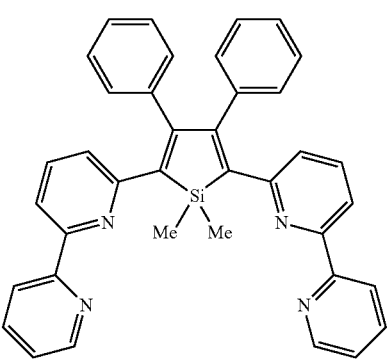
(17)

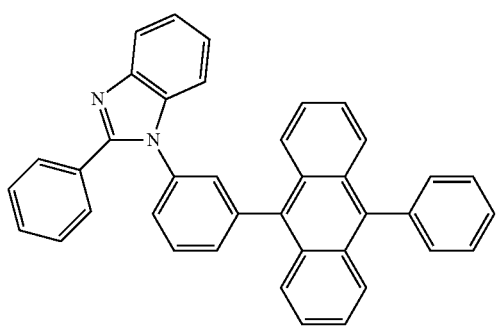
(18)

While the average thickness of the electron transport layer 62 is not particularly limited, approximately equal to or greater than 1 nm and equal to or less than 100 nm and approximately equal to or greater than 5 nm and equal to or less than 50 nm is more preferable. In so doing, it is possible to favorably transport the electrons that are injected from the electron injection layer 63 to the blue light emitting functional layer 5B.

Here, the electron transport layer 62 may be omitted depending on the combination of the type, the film thickness, and the like of the red light emitting functional layer 5R, the intermediate layer 61, the second hole transport layer 43, the blue light emitting functional layer 513, the electron injection layer 63, and the common cathode 8 that configure the light emitting element 1R.

Electron Injection Layer 63

The electron injection layer 63 has a function of improving the injection efficiency of electrons from the common cathode 8 to the electron transport layer 62.

While the constituent material of the electron injection layer 63 (electron injection material) is not particularly limited, it is possible to use the same material as the electron injection material that configures the intermediate layer 61 described above.

Here, since the constituent materials of the electron injection layer 63 and the intermediate layer 61 (electron injection material) are respectively chosen to have the optimum injection efficiency according to the combination of the constituent materials of the two layers that interpose the constituent materials of the electron injection layer 63 and the intermediate layer 61, the constituent materials of the electron injection layer 63 and the intermediate layer 61 may be the same or may be different.

While the average thickness of the electron injection layer 63 is not particularly limited, approximately equal to or greater than 0.01 nm and equal to or less than 100 nm is preferable, and approximately equal to or greater than 0.1 nm and equal to or less than 10 nm is more preferable.

Here, the electron injection layer 63 may be omitted depending on the combinations of types, film thicknesses, and the like of the electron transport layer 62 and the common cathode 8.

Common Cathode 8

The common cathode 8 is an electrode that injects electrons into the electron transport layer 62 via the electron injection layer 63.

It is preferable that the constituent material of the common cathode 8 be a material with a low work function. For example, Li, Mg, Ca, Sr, La, Ce, Er, Eu, Sc, Y, Yb, Ag, Cu, Al, Cs, Rb, Au, an alloy thereof, or the like is used as the constituent material of the common cathode 8 to be able to be formed using a gaseous phase process in the formation process of the common cathode 8 described later, and one or two or more types thereof may be used in combination (for example, a laminated body of a plurality of layers, or the like).

In particular, in the case of the organic EL device 100 of a bottom emission structure as in the present embodiment, light transmissivity is not demanded of the common cathode 8, and a metal or an alloy such as, for example, Al, Ag, AlAg, or AlNd is preferably used as the constituent material of the common cathode 8. By using such a metal or an alloy as the constituent material of the common cathode 8, the electron injection efficiency and the safety of the common cathode 8 can be improved.

While the average thickness of such a common cathode 8 is not particularly limited, approximately equal to or greater than 50 nm and equal to or less than 1000 nm is preferable, and approximately equal to or greater than 100 nm and equal to or less than 500 nm is more preferable.

Here, in a case when the organic EL device 100 is a display device of a top emission structure, it is preferable that a metal or an alloy such as MgAg, MgAl, MgAu, or AlAg be used as the constituent material of the common cathode 8. By using such a metal or an alloy as the constituent material of the common cathode 8, it is possible to improve the electron injection efficiency and the safety of the common cathode 8 while maintaining the light transmissivity of the common cathode 8.

While the average thickness of the common cathode 8 is not particularly limited, approximately equal to or greater than 1 nm and equal to or less than 50 nm is preferable, and approximately equal to or greater than 5 nm and equal to or less than 20 nm is more preferable.

Here, an arbitrary layer may be provided between each layer of the anode 3R, the hole injection layer 41R, the first hole transport layer 42R, the red light emitting functional layer 5R, the intermediate layer 61, the second hole transport layer 43, the blue light emitting functional layer 5B, the electron transport layer 62, the electron injection layer 63, and the common cathode 8 of the light emitting element 1R of such a configuration.

Light Emitting Element 1G

With the light emitting element (green color light emitting element) 1G, a laminated body in which the hole injection layer 41, the first hole transport layer 42, the green light emitting functional layer 5G, the carrier selection layer 46, the blue light emitting functional layer 5B, the electron transport layer 62, and the electron injection layer 63 are laminated in such an order from the anode 3G side is inserted between the anode 3G and the common cathode 8.

With the light emitting element 1G, the carrier selection layer 46 is configured by a laminated body in which the intermediate layer 61 and the second hole transport layer 43 are laminated in such an order from the anode 3G side. Further, with the light emitting element 1G, the anode 3G and the common cathode 8 respectively configure an individual electrode and a common electrode, the anode 30 functions as an electrode that injects holes into the hole injection layer 41, and the common cathode 8 functions as an electrode that injects electrons into the electron transport layer 62 via the electron injection layer 63.

While the light emitting element 10 will be described below, description will be centered on differences with the light emitting element 1R described above, and description of similar items will be omitted.

Other than including the green light emitting functional layer 5G instead of the red light emitting functional layer 5R, the light emitting element 1G has the same configuration as the light emitting element 1R described above.

Green Light Emitting Functional Layer 5G

The green light emitting functional layer 5G is configured to include a green light emitting material that emits green light.

With the light emitting element 1G, the green color emitting functional layer 5G configures the first layer that is provided between the anode 3G and the carrier selection layer 46, and the green light emitting functional layer 5G has a function of emitting light of the first color (green) by the light emitting element 1G.

While the constituent material of such a green light emitting functional layer 5G is not particularly limited, it is desirable that the constituent material be able to be dissolved or dispersed in a liquid, so that the constituent material can be formed using a liquid phase process during the formation process of the green light emitting functional layer 5G described later. Therefore, a high-molecular green light emitting material or a low-molecular green light emitting material that can be dissolved or dispersed in a solvent or a dispersal medium is preferably used as the constituent material of the green light emitting functional layer 5G, and an example thereof is a high-molecular green light emitting material of the phenylenevinylene derivatives represented by Chemical Formulae 19 and 20 below.

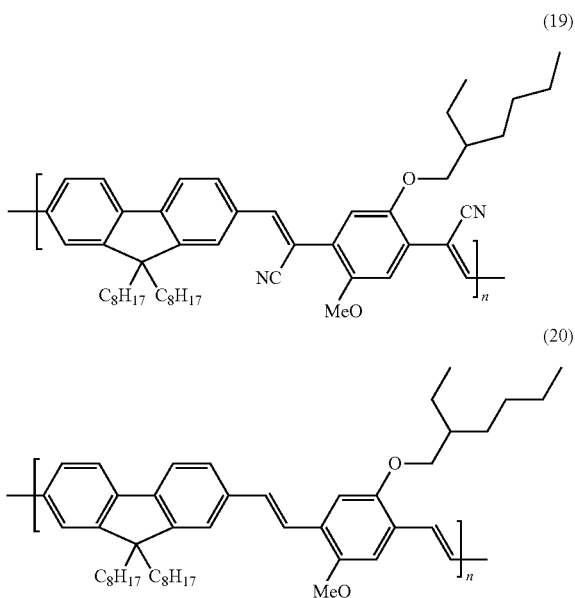

(19)

(20)

Here, the light emitting element 1G that includes the green light emitting functional layer 5G that is formed through such a liquid phase process has sufficient light emitting characteristics at a practical level.

While the average thickness of such a green light emitting functional layer 5G is not particularly limited, approximately equal to or greater than 10 nm and equal to or less than 150 nm is preferable, and approximately equal to or greater than 20 nm and equal to or less than 100 nm is more preferable.

Here, an arbitrary layer may be provided between each layer of the anode 3G, the hole injection layer 41, the first hole transport layer 42, the green light emitting functional layer 5G, the intermediate layer 61, the second hole transport layer 43, the blue light emitting functional layer 5B, the electron transport layer 62 the electron injection layer 63, and the common cathode 8 of the light emitting element 1G of such a configuration.

Blue Light Emitting Element 1B

With the light emitting element (blue light emitting element) 1B, a laminated body in which the hole injection layer 41, the carrier selection layer 46, the blue light emitting functional layer 5B, the electron transport layer 62, and the electron injection layer 63 are laminated in such an order from the anode 3B side is inserted between the anode 3B and the common cathode 8.

With the light emitting element 1B, the carrier selection layer 46 is configured by a laminated body in which the intermediate layer 61 and the second hole transport layer 43 as the third layer are laminated in such an order from the anode 3B side. Further, with the light emitting element 1B, the anode 3B and the common cathode 8 respective configure an individual electrode and a common electrode, the anode 3B functions as an electrode that injects holes into the hole injection layer 41, and the common cathode 8 functions as an electrode that injects electrons into the electron transport layer 62 via the electron injection layer 63.

While the light emitting element 1B will be described below, description will be centered on the differences from the light emitting element 1R described above, and description of similar items will be omitted.

The light emitting element 1B has the same configuration as the light emitting element 1R described above except that the formation of the first hole transport layer 42 and the red light emitting functional layer 5R is omitted and that the hole injection layer 41 and the carrier selection layer 46 have a configuration of being in contact with each other. However, due to the hole injection layer 41 and the carrier selection layer 46 having a configuration of being in contact with each other, the function of the carrier selection layer 46 in the light emitting element 1B differs greatly from the function of the carrier selection layer 46 in the light emitting element 1R and the light emitting element 1G. Further, there may also be a case when the function demanded of the hole injection layer 41 is also different.

Hole Injection Layer 41

The hole injection layer 41 has a function of facilitating the hole injection from the anode 33.

While the constituent material of the hole injection layer 41 (hole injection material) is not particularly limited, an ion conductive hole injection material in which an electron accepting dopant is added to a conductive high-molecular material (or a conductive oligomer material) is preferably used so that the constituent material can be formed using a liquid phase process during the formation process of the hole injection layer 41 described later.

Further, it is desirable that a material in which the electron injection material that configures the intermediate layer 61 is easily dispersed or absorbed be selected as the constituent material of the hole injection layer 41 (hole injection material). In so doing, the carrier blocking action in the light emitting element 1B of the carrier selection layer 46 is performed accurately. An example of a hole injection material in which the electron injection material that configures the intermediate layer 61 is easily dispersed or absorbed is an ion conductive hole injection material.

As such an ion conductive hole injection material, the same material as the constituent material of the hole injection layer 41 (hole injection material) described above may be used.

Carrier Selection Layer 46

The carrier selection layer 46 is configured by a laminated body in which the intermediate layer 61 and the second hole transport layer 43 are laminated in such an order from the anode 3B side. The same materials as those of the intermediate layer 61 and the second hole transport layer 43 of the light emitting element 1R described above respectively may be used as the materials to configure the intermediate layer 61 and the second hole transport layer 43.

With the light emitting element 1B, the carrier selection layer 46 performs a carrier blocking action of blocking the electrons that flow from the blue light emitting functional layer 5B to the carrier selection layer 46 and keeping such electrons in the blue light emitting functional layer 5B. Therefore, the blue light emitting functional layer 5B of the light emitting element 1B emits light efficiently. In order to perform the carrier blocking action accurately, it is desirable that a second hole transport layer 43 of the light emitting element 1B with a carrier blocking function be used. For example, by using an amine-based compound exemplified as the constituent material of the second hole transport layer 43 of the light emitting element 1R described above, the second hole transport layer 43 has an electron blocking function.

Here, an arbitrary layer may be provided between each layer of the anode 3B, the hole injection layer 41B, the intermediate layer 61, the second hole transport layer 43, the blue light emitting functional layer 5B, the electron transport layer 62, the electron injection layer 63, and the common cathode 8 of the light emitting element 1B with such a configuration.

The workings and effects of the light emitting elements 1R, 1G, and 1B will be described below centered on the function of the carrier selection layer 46.

According to the present embodiment, the carrier selection layer 46 is configured by a laminated body in which the intermediate layer 61 and the second hole transport layer 43 are laminated in such an order from the anode (3R, 3G, and 3B) side.

The carrier selection layer 46 with such a configuration is a layer with a function of controlling the amount of electrons that are injected from the blue light emitting functional layer 5B into the carrier selection layer 46 according to the layer that is in contact with the anode (3R, 3G, and 3B) side of the carrier selection layer 46.

Specifically, as with the light emitting element 1R and the light emitting element 10, in a case when the layers that are in direct contact with the anode (3R and 3G) side of the carrier selection layer 46 are respectively the red light emitting functional layer 5R and the green light emitting functional layer 50, that is, in a case when the light emitting functional layers 5R and 5G with a function of emitting light of the first color are in contact with the anode 3R and 3G side interface of the carrier selection layer 46, the carrier selection layer 46 smoothly injects the electrons that flow from the blue light emitting functional layer 5B into the carrier selection layer 46 into the red light emitting functional layer 5R and the green light emitting functional layer 50 (carrier injection action). Therefore, since the recoupling of the holes and the electrons is accurately suppressed or prevented in the light emitting functional layer 5B of the light emitting element 1R, the blue light emitting functional layer 5B of the light emitting element 1R either does not emit blue light, or even when blue light is emitted, such light emission is accurately suppressed.

On the other hand, as well as electrons being supplied (injected) from the common cathode 8 side to the red light emitting functional layer 5R via the blue light emitting functional layer 5B, holes are supplied (injected) from the anode 3R side. Furthermore, in the red light emitting functional layer 5R, since the holes and the electrons are recoupled, excitons are generated by such recoupling, and energy is released as fluorescence or phosphorescence when the excitons return to the ground state, the red light emitting functional layer 5R emits red light. As a result, the light emitting element 1R emits red light. Similarly, even with the light emitting element 1G, the light emission of the blue light emitting functional layer 5B is greatly suppressed, and the green light emitting functional layer 5G selectively or dominantly emits light. As a result the light emitting element 1G emits green light.

On the other hand, in a case when the layer that is in contact with the anode 3B side of the carrier selection layer 46 is the hole injection layer 41 as with the light emitting element 1B, that is, in a case when the hole injection layer 41 is in contact with an anode side interface of the carrier selection layer 46, the carrier selection layer 46 blocks the electrons that flow from the blue light emitting functional layer 5B into the carrier selection layer 46 and keeps the electrons within the blue light emitting functional layer 5B (carrier blocking action). Therefore, in the blue light emitting functional layer 5B, the holes that are supplied (injected) from the anode 3B side and the electrons that are supplied (injected) from the common cathode 8 side are easily recoupled. Since excitons are generated due to such recoupling and energy is released as fluorescence or phosphorescence when the excitons return to a ground state, the blue light emitting functional layer 5B emits light. As a result, the light emitting element 1B emits blue light with high efficiency.

In such a manner, the carrier selection layer 46 performs a carrier injection action or a carrier blocking action depending on the type of layer that is in contact with the carrier selection layer 46.

The reason for the difference in the behavior of the carrier selection layer 46 with respect to the electrons in the light emitting element 1R and the light emitting element 1G and the behavior of the carrier selection layer 46 with respect to the electrons in the light emitting element 1B will be described with a case when the hole injection layer 41 is an ion-conductive hole injection material as an example.

First, in a case when the layers that are in contact with the anode (3R, 3G) side of the carrier selection layer 46 are respectively the red light emitting functional layer 5R and the green light emitting functional layer 5G as with the light emitting element 1R and the light emitting element 1G, the electron injection materials that configure the intermediate layer 61 within the carrier selection layer 46 of the light emitting element 1R and the light emitting element 1G are respectively dispersed within the second hole transport layer 43 of the light emitting element 1R and the light emitting element 1G, and in so doing, the electron blocking function of the second hole transport layer 43 of the light emitting element 1R and the light emitting element 1G decrease greatly. As a result, with the light emitting element 1R and the light emitting element 1G, the electrons are injected smoothly from the blue light emitting functional layer 5B to the second hole transport layer 43. Furthermore, due to the function of the intermediate layer 61 that exists in between the red light emitting functional layer 5R and the green light emitting functional layer 5G and the second hole transport layer 43, the injection of electrons from the second hole transport layer 43 to the red light emitting functional layer 5R and the green light emitting functional layer 5G is also performed smoothly.

By the above, as with the light emitting element 1R and the light emitting element 1G, in a case when the layers that are in contact with the anode (3R, 3G) side of the carrier selection layer 46 are respectively the red light emitting functional layer 5R and the green light emitting functional layer 5G, the carrier selection layer 46 smoothly injects the electrons that flow from the blue light emitting functional layer 5B into the carrier selection layer 46 respectively to the red light emitting functional layer 5R and the green light emitting functional layer 5G (carrier injection action). That is, the carrier selection layer 46 performs the action of causing electrons (carriers) to flow smoothly from the blue light emitting functional layer 5B to the red light emitting functional layer 5R and the green light emitting functional layer 5G.

On the other hand, in a case when the layer that is in contact with the anode 3B side of the carrier selection layer 46 is the hole injection layer 41 and the hole injection layer 41 is configured by an ion-conductive hole injection material as with the light emitting element 1B, since the electron injection material that configures the intermediate layer 61 within the carrier selection layer 46 of the light emitting element 1B is violently dispersed within the hole injection layer 41 or adsorbed on the common cathode 8 side interface of the second hole transport layer 41, the electron injection material is not dispersed within the second hole transport layer 43 of the light emitting element 1B, and the electron blocking function of the second hole transport layer 43 of the light emitting element 1B does not decrease. As a result, with the light emitting element 1B, the electrons that flow from the blue light emitting functional layer 5B to the second hole transport layer 43 are blocked by the second hole transport layer 43 and remain within the blue light emitting functional layer 5B. By the above, in a case when the layer that is in contact with the anode 3B side of the carrier selection layer 46 is the hole injection layer 41, the carrier selection layer 46 blocks the electrons that flow from the blue light emitting functional layer 5B and the carrier selection layer 46 and keeps the electrons within the blue light emitting functional layer 5B (carrier blocking action). That is, the carrier selection layer 46 performs an action of suppressing the flow of the electrons (carriers) that flow from the blue light emitting functional layer 5B.

According to the present embodiment, the intermediate layer 61 that configures the carrier selection layer 46 is formed by an application method (liquid phase process). If the electron injection material is directly formed by a deposition method or the electron injection material is formed by an application method along, the electron injection material agglomerates and becomes an unstable state. That is, since there are regions in which the electron injection material is present and regions in which the electron injection material is not present, while carrier control is possible in regions in which the electron injection material is present, carrier control is difficult in regions in which the electron injection material is not present.

Therefore, by creating an ink in which the electron injection material is dispersed in a high-molecular or low-molecular organic compound and forming the intermediate layer 61 by an application method (liquid phase process), the agglomeration of the electron injection material can be suppressed, and an intermediate layer 61 in which stable carrier control is possible can be formed.

It has been found by the present inventors that with a red light emitting element of a configuration in which the carrier selection layer 46 is excluded from the light emitting element 1R and the blue light emitting functional layer 5B and the red light emitting functional layer 5R are laminated in contact with each other, if a voltage is applied between the anode 3R and the common cathode 8 of the red light emitting element, it is not possible to smoothly inject (supply) the electrons that are injected from the common cathode 8 side into the blue light emitting function layer 5B to the red light emitting functional layer 5R, and since the holes and the electrons are recoupled in the blue light emitting functional layer 5B as a result, the blue light emitting functional layer 5B emits blue light, and the color purity of the red of the red light emitting element deteriorates.

Further, it has been found that with the red light emitting element, since it is not possible to smoothly inject (supply) the electrons that are injected from the common cathode 8 side to the blue light emitting functional layer 5B into the red light emitting functional layer 5R, the carrier balance between the electrons and the holes in the red light emitting functional layer 5R is disturbed, and that the light emitting efficiency decreases.

Furthermore, it has been found that with the red light emitting element, since it is not possible to smoothly inject (supply) the electrons that are injected from the common cathode 8 side to the blue light emitting functional layer 5B into the red light emitting functional layer 5R, the energy barrier against the carriers at the cathode side interface of the red light emitting functional layer 5R increases, and that the driving voltage rises.

In such a manner, with a red light emitting element in which the carrier selection layer 46 is excluded, there are problems that the red color purity deteriorates, the light emitting efficiency decreases, and the driving voltage rises. However, since by adopting a configuration in which the carrier selection layer 46 is inserted between the blue light emitting functional layer 5B and the red light emitting functional layer 5R as with the light emitting element 1R, it is possible to smoothly inject (supply) the electrons that are injected from the common cathode 8 side into the blue light emitting functional layer 5B into the red light emitting functional layer 5R without keeping the electrons in the blue light emitting functional layer 5B, and such problems are all resolved.

Similarly, with a green color emitting element with a configuration in which the carrier selection layer 46 is excluded from the light emitting element 1G and the blue light emitting functional layer 5B and the green light emitting functional layer 5G are laminated in contact with each other, it is not possible to smoothly inject (supply) the electrons that are injected from the common cathode 8 side into the blue light emitting functional layer 5B into the green light emitting functional layer 5G, and as a result, there are problems such as a deterioration in the green color purity, a decrease in the light emitting efficiency, and an increase in the driving voltage. However, since by adopting a configuration in which the carrier selection layer 46 is inserted between the blue light emitting functional layer 5B and the green light emitting functional layer 5G as with the light emitting element 1G, it becomes possible to smoothly inject (supply) the electrons that are injected from the common cathode 8 side into the blue light emitting functional layer 5B into the green light emitting functional layer 5G without keeping the electrons in the blue light emitting functional layer 5B, and such problems are all resolved.

Further, it is preferable that the second hole transport layer 43 and the blue light emitting functional layer 5B of the present embodiment are formed using a gaseous phase process. It has been found by the inventors that with the light emitting element 1B, with a blue light emitting element with a configuration in which a liquid phase process such as an ink jet method is used in the formation of at least one layer out of the second hole transport layer 43 and the blue light emitting functional layer 5B, there is a problem that the light emitting life or the light emitting efficiency thereof decreases compared to the light emitting element 1B.

It is considered that contamination of at least one layer out of the second hole transport layer 43 and the blue light emitting functional layer 5B is one of the causes of such problems. That is, while in a case when it is possible to form the second hole transport layer 43 and the blue light emitting functional layer 5B using a gaseous phase process as with the light emitting element 1B, it is possible to continuously form the next blue light emitting functional layer 5B without exposing the common cathode 8 side interface of the second hole transport layer 43 to an atmosphere other than a vacuum, since if a liquid phase process is used for the formation of at least one layer out of the second hole transport layer 43 and the blue light emitting functional layer 5B, film formation by a liquid phase process is difficult to perform in a vacuum atmosphere, film formation by a liquid phase process is performed in an atmosphere other than a vacuum (for example, air or nitrogen), and at least the common cathode 8 side interface of the second hole transport layer 43 is exposed to an atmosphere other than a vacuum.

It is clear than in a case when at least one layer out of the second hole transport layer 43 and the blue light emitting functional layer 5B is formed using a liquid phase process in such a manner, the common cathode 8 side interface of the second hole transport layer 43 tends to become contaminated. Further, in a case when the second hole transport layer 43 is formed by a liquid phase process, since a solution in which the hole transport material is dissolved or dispersed in a solvent or a dispersant is used in the film formation, there is a possibility that a miniscule amount of the solvent may remain within the second hole transport layer 43 and contaminate the entirety of the second hole transport layer 43.

Similarly, in a case when the blue light emitting functional layer 5B is formed by a liquid phase process, there is a possibility that a miniscule amount of the solvent may remain within the blue light emitting functional layer 5B contaminate the entirety of the blue light emitting functional layer 5B.

On the other hand, by forming the second hole transport layer 43 and the blue light emitting functional layer 5B using a gaseous phase process as with the light emitting element 1B, contamination of the second hole transport layer 43 and the blue light emitting functional layer 5B by forming at least one layer out of the second hole transport layer 43 and the blue light emitting functional layer 5B using a liquid phase process can be avoided, and all of the problems such as a decrease in the light emitting life and the light emitting efficiency of the blue light emitting element by forming at least one layer out of the second hole transport layer 43 and the blue light emitting functional layer 5B are resolved.

Manufacturing Method of Organic EL Device

Next, a manufacturing method of the organic EL device 100 of the present embodiment will be described with reference to FIG. 2.

[1] First, the substrate 21 is prepared, and after forming a plurality of driving transistors (driving TFT) 24 to correspond to the subpixels 100R, 100G, and 100B to be formed, a flattening portion 22 is formed to cover the driving transistors 24 (first process)

1-A; Formation Process of Driving TFTs 24

[1-Aa] First, a semiconductor film that is configured with an amorphous silicon with an average thickness of approximately equal to or greater than 30 nm and equal to or less than 70 nm as the principal material is formed on the substrate 21 by, for example, a plasma CVD method or the like.

[1-Ab] Next, the amorphous silicon is changed into a polysilicon by performing a crystallization process on the semiconductor film by laser annealing, a solid-phase growth method, or the like.

Here, with the laser annealing method, for example, a line beam in which the length of the beam used by an excimer laser is 400 mm is used, and the output strength thereof is set to approximately 200 mJ/cm$^2$, for example.

[1-Ac] Next, the semiconductor layer 241 is obtained by patterning the semiconductor film to create an island chain shape, and the gate insulating layer 242 that is configured by silicon oxide, silicon nitride, or the like with an average thickness of approximately equal to or greater than 60 nm and equal to or less than 150 nm as the principal material by a plasma CVD method or the like with TEOS (tetraethoxysilane) or oxygen gas, for example, as the raw material gas to cover the island chain-shaped semiconductor layer 241.

[1-Ad] Next, after forming a conductive film that is configured by a metal such as aluminum, tantalum, molybdenum, titanium, or tungsten as the principal material on the gate insulating layer 242 by a sputtering method, for example, the gate electrode 243 is formed by patterning.

[1-Ae] Next, a source drain region is formed in a self-aligning manner with respect to the gate electrode 243 by injecting high concentrations of phosphorous ions in such a state.

[1-B] Next, the source electrode 244 and the drain electrode 245 that are electrically connected to the driving TFTs 24 are formed.

[1-Ba] First, after forming a first flattening layer (not shown) to cover the gate electrode 243, a contact hole is formed.

[1-Bb] Next, the source electrode 244 and the drain electrode 245 are formed within the contact hole.

[1-C] Next, a wiring (relay electrode) 27 that electrically connects the drain electrode 245 with each of the anodes 3R, 3G, and 3B is formed.

[1-Ca] First, after forming a second flattening layer (not shown) on the first flattening layer, a contact hole is formed.

[1-Cb] Next, the wiring 27 is formed within the contact hole.

Here, the flattening layer 22 is configured by the first flattening layer and the second flattening layers that are formed in the 1-B process and the 1-C process.

[2] Next, the anodes (individual electrodes) 3R, 3G, and 3B are formed to correspond to each wiring 27 on the flattening layers 22 (second process).

The anodes 3R, 3G, and 3B can be obtaining by patterning after forming a thin film that is configured with the constituent material of the anodes 3R, 3G, and 3B as the principal material on the flattening layer 22.

[3] Next, the bulkhead (bank) 31 is formed on the flattening layer 22 to divide each of the anodes 3R, 3G, and 3B, that is, in order to divide a region in which each of the light emitting elements 1R, 1G, and 1B (subpixels 100R, 100G, and 100B) is formed (third process).

The bulkhead 31 can be formed by patterning using a photolithography method, for example, so that each of the anodes 3R, 3G, and 3B are exposed after forming an insulating film on the flattening layer 22 to cover each of the anodes 3R, 3G, and 3B.

Here, the constituent material of the bulkhead 31 is selected in consideration of heat resistance, liquid repellency, ink solvent resistance, and adhesion to the flattening layer 22 and the like.

Specifically, examples of the constituent material of the bulkhead 31 include organic materials such as an acrylic resin, a polyimide resin, or an epoxy resin, and inorganic materials such as $SiO_2$.

Further, as illustrated in FIG. 1, other than squares, the openings of the bulkhead 31, that is, the shapes of the subpixels 100B, 100G, and 100E in plan view may be any shape such as circles, ellipses, or polygons such as hexagons.

Here, in a case when the shapes of the openings of the bulkhead 31 are polygons, it is preferable that the corner portions be rounded. In so doing, when forming the hole injection layers 41R, 41G, and 41B, the first hole transport layer 42R and 42G, and the light emitting functional layers 5R and 5G using a liquid material described later, such a liquid material can be supplied securely to the corners of the space on the inside of the bulkhead 31.

While the height of such a bulkhead 31 is set as appropriate according to the thicknesses of the light emitting elements 1R, 1G, and 1B and is not particularly limited, approximately equal to or greater than 0.5 μm and equal to or less than 5 μm is preferable. By setting such a height, the function of the bulkhead (bank) 31 is sufficiently exhibited.

Here, in a case when the hole injection layers 41R, 41G, and 41B, the first hole transport layer 42R and 42G, and the light emitting functional layers 5R and 5G are formed by an ink jet method, it is desirable that the substrate 21 on which the bulkhead 31 is formed be plasma processed. Specifically, the surface of the substrate 21 on which the bulkhead 31 is formed is first plasma processed with $O_2$ gas as the processing gas. In so doing, the surfaces of the anodes 3R, 3G, and 3B and the bulkhead 31 (including the wall surfaces) are activated and become lyophilic. Next, plasma processing is performed with a fluorine-based gas such as $CF_4$ gas as the processing gas. In so doing, the fluorine-based gas only reacts with the surface of the bulkhead 31 composed of a photosensitive resin that is an organic material to become liquid-repelling. In so doing, the function of the bulkhead 31 as a bulkhead is more effectively exhibited.

[4] Next, the hole injection layer 41R, the first hole transport layer 42R, and the red light emitting functional layer 5R are formed on the inside of the bulkhead 31 that is positioned in a region in which the light emitting element 1R is to be formed, the hole injection layer 41G, the first hole transport layer 42G, and the green light emitting functional layer 50 are formed on the inside of the bulkhead 31 that is positioned in a region in which the light emitting element 1G is to be formed, and the hole injection layer 41B is formed on the inside of the bulkhead 31 that is positioned in a region in which the light emitting element 1B is to be formed (fourth process). The fourth process will be described in detail below for each of the light emitting elements 1R, 1G, and 1B.

Light Emitting Element 1R

The hole injection layer 41R, the first hole transport layer 42R, and the red light emitting functional layer 5R are formed in such an order on the inside of the bulkhead 31 that is positioned in a region in which the light emitting element 1R is to be formed. The processes of forming the respective layers are referred to as the hole injection layer 41R formation process, the first hole transport layer 42R formation process, and the red light emitting functional layer 5R formation process, and will be described in detail below.

Formation Method of Hole Injection Layer 41R

First, the hole injection layer 41R is applied by an ink jet method. Specifically, the ink for forming the hole injection layer 41R which includes the hole injection material (liquid material) is discharged from the head of an ink jet printing device and applied on the anode 3R (application process).

Here, examples of the solvent (ink solvent) or the dispersion medium (ink dispersion medium) that is used in the preparation of the ink for forming the hole injection layer include various inorganic solvents such as nitric acid, sulfuric acid, ammonia, hydrogen peroxide, water, carbon disulfide, carbon tetrachloride, and ethylene carbonate, various organic solvents such as ketone-based solvents such as methyl ethyl ketone (MEK), acetone, diethyl ketone, methyl isobutyl ketone (MIBK), methyl isopropyl ketone (MIPK), and cyclohexanone, alcohol-based solvents such as methanol, ethanol, isopropanol, ethylene glycol, diethylene glycol (DEG), and glycerin, ether-based solvents such as diethyl ether, diisopropyl ether, 1,2-dimethoxyethane (DME), 1,4-dioxane, tetrahydrofuran (THF), tetrahydropyran (THP), anisole, diethylene glycol dimethyl ether (diglyme), and diethylene glycol ethyl ether (carbitol), cellosolve-based solvents such as methyl cellosolve, ethyl cellosolve, and phenyl cellosolve, aliphatic hydrocarbon-based solvents such as hexane, pentane, heptane, and cyclohexane, alicyclic hydrocarbon-based solvents such as cyclohexane and tetralin, aromatic hydrocarbon-based solvents such as toluene, xylene, benzene, trimethylbenzene, and tetramethylbenzene, aromatic heterocyclic compound-based solvents such as pyridine pyrazine, furan, pyrrole, thiophene, and methylpyrrolidone, amide-based solvents such as N,N-dimethylformamide (DMF), N,N-dimethylacetamide (DMA), halogen compound-based solvents such as dichloromethane, chloroform, and 1,2-dichloroethane, ester-based solvents such as ethyl acetate, methyl acetate, and ethyl formate, sulfur compound-based solvents such as dimethyl sulfoxide (DMSO) and sulfolane, nitrile-based compounds such as nitrile acetonitrile, propionitrile, and acrylonitrile, and organic acid-based solvents such as formic acid, acetic acid, trichloroacetic acid, and trifluoroacetic acid or a mixed solvent including the above.

Here, the liquid material that is applied on the anode 3R has high fluidity (low viscosity) and naturally spreads in the horizontal direction (surface direction), since the anode 3R is surrounded by the bulkhead 31, the liquid material is prevented from spreading beyond a predetermined region, and the contour of the hole injection layer 41R is accurately regulated.

Next, post-processing is performing on the applied hole injection layer 41R (post-processing process). Specifically, the hole injection layer 41R is formed by drying the ink for forming the hole injection layer which is applied on the anode 3R (liquid material). The solvent or the dispersal medium can be removed by such drying. Examples of the drying method include a method of leaving the ink in a decompressed atmosphere, a method of a heating process (for example, approximately equal to or greater than 40° C. and equal to or less than 80° C.), a method by the flow of an inert gas such as nitrogen gas, and the like. Furthermore, the substrate 21 on which the hole injection layer 41R is formed is heated (baked) at approximately equal to or greater than 100° C. and equal to or less than 300° C. as necessary. The solvent or the dispersal medium that remains within the film of the hole injection layer 41R after the drying can be removed by such heating. Further, in a case when a hole injection material that is cross-linked by the heating and that is insolubilized with respect to the solvent is used, it is also possible to insolubilize the hole injection layer 41R by the heating. Further, the surface of the substrate 21 on which the hole injection layer 41R is formed may be rinsed by a solvent in order to remove insolubilized portions of the hole injection layer 41R. By such rinsing, it is possible to prevent the insolubilized portions of the hole injection layer 41R from mixing into the first hole transport layer 42R that is formed on the hole injection layer 41R.

Formation Process of First Hole Transport Layer 42R

In the formation process of the first hole transport layer 42R, the first hole transport layer 42R is first applied on the hole injection layer 41R by the same ink jet method as with the formation process of the hole injection layer 41R, and next, the same post-processing as with the formation process of the hole injection layer 41R is performed on the applied first hole transport layer 42R. However, the ink solvent or the ink dispersal medium that used in the ink for forming the first hole transport layer 42R, the methods, the conditions, and the like of the post-processing are selected as appropriate to suit the formation of the first hole transport layer 42R.

Formation Method of Red Light Emitting Functional Layer 5R

In the formation process of the red light emitting functional layer 5R, the red light emitting functional layer 5R is first applied on the first hole transport layer 42R by the same ink jet method as with the formation process of the hole injection layer 41R, and next, the same post-processing as with the formation process of the hole injection layer 41R is performed on the applied red light emitting functional layer 5R. However, the ink solvent or the ink dispersal medium that used in the ink for forming the red light emitting functional layer 5R, the methods, the conditions, and the like of the post-processing are selected as appropriate to suit the formation of the red light emitting functional layer 5R.

It is preferable that an ink jet method be used in the formation process of the hole injection layer 41R, the formation process of the first hole transport layer 42R, and the formation process of the red light emitting functional layer 5R. With an ink jet method, since it is possible to control the discharge amount of the ink and the landing positions of ink drops with high precision regardless of the size of the area of the substrate 21, by using such a method, it is possible to make the hole injection layer 41R thin, to decrease the sizes of pixels, and to increase the area of the organic EL device 100. Further, since it is possible to selectively supply the ink for forming each layer (liquid material) to the inside of the bulkhead 31, it is possible to curtail waste of the ink. However, without being limited to an ink jet method in the formation method of the hole injection layer 41R, the formation method of the first hole transport layer 42R, and the formation method of the red light emitting functional layer 5R, a gaseous phase process such as a sputtering method, a vacuum deposition method, or a CVD method, or a liquid phase process such as a spin coating method (pyrosol method), a casting method, a micro gravure coating method, a gravure coating method, a bar coating method, a roller coating method, a wire bar coating method, a dip coating method, a spray coating method, a screen printing method, a flexographic printing method, or an offset printing method, for example, may be used.

Light Emitting Element 1G

The hole injection layer 41G, the first hole transport layer 42G, and the green light emitting functional layer 5G are formed in such an order using the same method as with the light emitting element 1R on the inside of the bulkhead 31 that is positioned in a region in which the light emitting element 1G is to be formed. However, the ink solvent or the ink dispersal medium that is used in the ink for forming the respective layers of the hole injection layer 41G, the first hole transport layer 42G, and the green light emitting functional layer 5G, the methods, the conditions, and the like of the post-processing are selected as appropriate to suit the formation of the respective layers.

Light Emitting Element 1B

The hole injection layer 41B is formed using the same method as with the formation process of the hole injection layer 41R of the light emitting element 1R on the inside of the bulkhead 31 that is positioned in a region in which the light emitting element 1B is to be formed. However, the ink solvent or the ink dispersal medium that is used in the ink for forming the hole injection layer 41B, the methods, the conditions, and the like of the post-processing are selected as appropriate to suit the formation of the hole injection layer 41B.

In a case when each layer of the hole injection layers 41R, 41G, and 41B, the first hole transport layers 42R and 42G, and the light emitting functional layers 5R and 5G is formed by an ink jet method as described above, while each layer is formed completely through an application process and a post-processing process, the application process of each layer may be performed at the same time as the application processes of the other layers, and the post-processing process of each layer may be performed at the same time as the post-processing processes of the other layers.

[5] Next, the intermediate layer 61 is formed so that the red light emitting functional layer 5R, the green light emitting functional layer 5G, the hole transport layer 41B, and the bulkhead 31 overlap, that is, so that the entire face of the opposite side to the face of the bulkhead 31 which is in contact with the flattening layer 22 is covered (fifth process).

In so doing, a common intermediate layer 61 is formed all together (integrally) on each of the light emitting elements 1R, 1G, and 1B.

The intermediate layer 61 may be formed to cover the red light emitting functional layer 5R, the green light emitting functional layer 5G, and the hole injection layer 41B by using a liquid in a state in which an organic material in which the electron injection material is dispersed as described above is dissolved or dispersed in a solvent or a dispersal medium. Alternatively, the intermediate layer 61 can be formed by using an ink jet method and discharging and drying the liquid as droplets in each region that is surrounded by the bulkhead 31. It is preferable that a high-molecular compound be used as the organic material with the former method, and it is preferable that a low-molecular compound be used as the organic material with the latter method.

[6] Next, the second hole transport layer 43 is formed to cover the entire face of the intermediate layer 61 (sixth process). In so doing, a common second transport layer 43 is formed all together on each of the light emitting elements 1R, 1G, and 1B.

[7] Next, the blue light emitting functional layer 5B is formed to cover the entire face of the second hole transport layer 43 (seventh process). In so doing, a common blue light emitting functional layer 5B is formed all together on each of the light emitting elements 1R, 1G, and 1B.

[8] Next, the electron transport layer 62 is formed to cover the entire face of the blue light emitting functional layer 5B (eighth process). In so doing, a common electron transport layer 62 is formed all together on each of the light emitting elements 1R, 1G, and 1B.

[9] Next, the electron injection layer 63 is formed to cover the entire face of the electron transport layer 62 (ninth process). In so doing, a common electron injection layer 63 is formed all together on each of the light emitting elements 1R, 1G, and 1B.

[10] Next, the common cathode 8 is formed to cover the entire face of the electron injection layer 63 (tenth process). In so doing, a common cathode 8 that is common to each of the light emitting elements 1R, 1G, and 1B is formed all together.

Here, while each of the layers formed in the processes 6 to 10 described above can also be formed by the gaseous phase processes or the liquid phase processes described in the process of the light emitting element 1R described above, of such processes, it is preferable that a gaseous phase process be used. By using a gaseous phase process, the layers to be formed can be formed securely while preventing layer dissolution between adjacent layers.

Further, by forming the respective light emitting functional layers 5R and 5G using a liquid phase process such as an ink jet method in the processes of the light emitting element 1R and the light emitting element 1G described above, the light emitting functional layers 5R and 5G with different light emitting colors can be easily applied separately, and the expansion in area of the organic EL device 100 can be easily realized. In addition, by forming the respective second hole transport layer 43 and the blue light emitting functional layer 5B using a gaseous phase process (gaseous phase film forming method) in the processes of 6 and 7 described above, the light emitting element 1B has sufficient light emitting life at a practical level. Furthermore, due to the configuration in which a common blue light emitting functional layer 5B is formed all together (integrally) with each of the light emitting elements 1R, 1G, and 1B and there is no need to selectively form the blue light emitting functional layer 5B with respect to the light emitting element 1B using a high definition mask, simplification of the processes and expansion in the size of the organic EL device 100 can be easily realized.

Further, due to the configuration of respectively forming a common intermediate layer 61 and second hole transport layer 43 all together with each of the light emitting elements 1R, 1G, and 1B in the processes of 5 and 6 described above, that is, due to the configuration of forming the carrier selection layer 46 that is configured by the intermediate layer 61 and the second hole transport layer 43 integrally, since there is no need to selectively form the intermediate layer 61 and the second hole transport layer 43 with respect to the light emitting element 1B using a high definition mask, simplification of the processes and expansion in the size of the organic EL device 100 can be easily realized.

By the above, the plurality of light emitting elements 1R, 1G, and 1B that respectively emit red, green, and blue light are formed to correspond with the driving transistors 24.

[11] Next, the sealing substrate 20 is prepared, and after interposing an epoxy-based adhesive between the common cathode 8 and the sealing substrate 20, the adhesive is dried.

In so doing, the common cathode 8 and the sealing substrate 20 can be joined via the epoxy layer 35 to cover the cathode 8 by the sealing substrate 20.

The sealing substrate 20 exhibits a function as a protective substrate of protecting each of the light emitting elements 1R, 1G, and 1B. By adopting a configuration in which the sealing substrate 20 is provided on the common cathode 8, since it is possible to more effectively prevent or reduce contact of the light emitting elements 1R, 1G, and 1B with oxygen or moisture, an increase in reliability, prevention of alterations and degradations, and the like of the light emitting elements 1R, 1G, and 1B can be securely obtained.

Through such processes, the organic EL device (the display device of the invention) 100 in which each of the light emitting elements 1R, 1G, and 1B are sealed by the sealing substrate 20 is completed.

Second Embodiment

Figure 4:
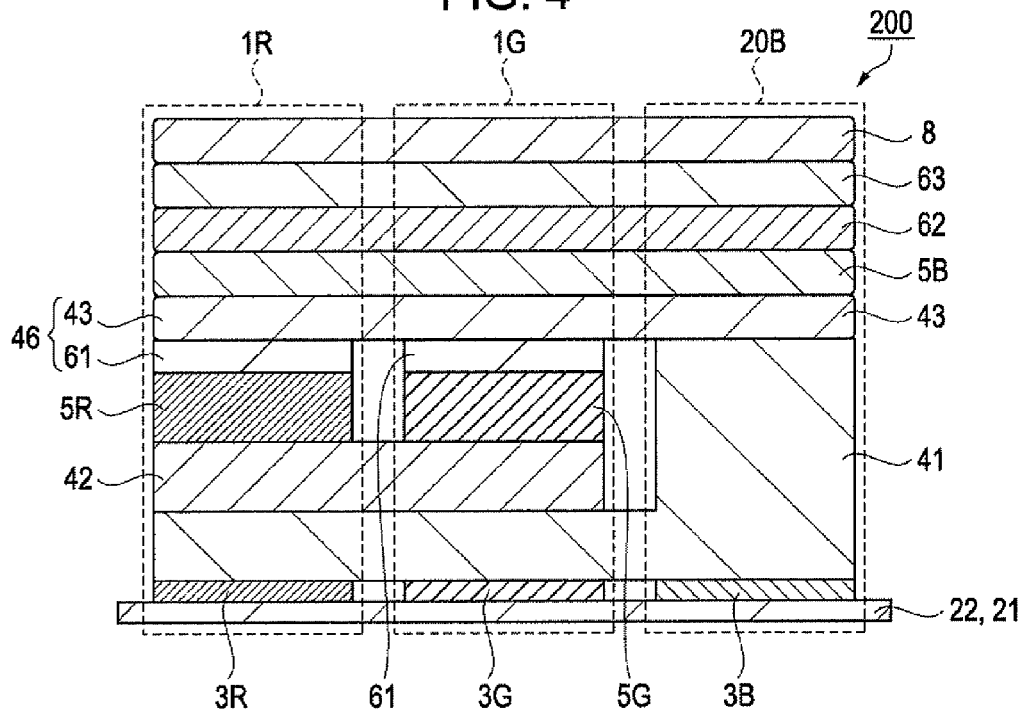
FIG. 4 is a schematic diagram that illustrates the configuration of light emitting elements of an organic EL device of a second embodiment.

Next, an organic EL device of a second embodiment will be described with reference to FIG. 4. FIG. 4 is a schematic diagram that illustrates a configuration of light emitting elements according to the organic EL device of the second embodiment.

The organic EL device of the second embodiment has a different configuration for the blue light emitting element 1B from the first embodiment. Therefore, the same reference symbols are given to configurations that are the same as the first embodiment described above, and detailed description will be omitted.

Specifically, as illustrated in FIG. 4, an organic EL device 200 of the present embodiment includes the light emitting element 1R by which red (R) light emission is obtained, the light emitting element 1G by which green (G) light emission is obtained and the a light emitting element 20B by which blue light emission is obtained on the substrate 21.

The configuration of the light emitting element 1R is the same as in the first embodiment described above, and the anode 3R, the hole injection layer 41, the first hole transport layer 42, the red light emitting functional layer 5R as the first layer, the intermediate layer 61 and the second hole transport layer 43 as the third layer, the blue light emitting functional layer 5B as the second layer, the electron transport layer 62, the electron injection layer 63, and the common cathode 8 are laminated in such an order on the flattening layer 22.

Further, the configuration of the light emitting element 1G is the same as in the first embodiment described above, and the anode 3G, the hole injection layer 41, the first hole transport layer 42, the green light emitting functional layer 5G as the first layer, the intermediate layer 61 and the second hole transport layer 43 as the third layer, the blue light emitting functional layer 5B as the second layer, the electron transport layer 62, the electron injection layer 63, and the common cathode 8 are laminated in such an order on the flattening layer 22.

With the light emitting element 20B, the anode 3B, the hole injection layer 41*m* the second hole transport layer 43, the blue light emitting functional layer 5B as the second layer, the electron transport layer 62, the electron injection layer 63, and the common cathode 8 are laminated in such an order on the flattening layer 22. That is, the light emitting element 20B has a configuration in which the intermediate layer 61 as the third layer is excluded from the configuration of the light emitting element 1B of the first embodiment described above.

The red light emitting functional layer 5R and the green light emitting functional layer 5G as the first layer and the intermediate layer 61 composed of an organic material in which an electron injection material is dispersed as the third layer are formed using a liquid phase process. In particular, if an ink jet method is used as the liquid phase process, as with the description of the first embodiment described above, the required red light emitting functional layer 5R, green light emitting functional layer 5G, and intermediate layer 61 can be formed by being laminated by discharging a predetermined amount of a solution that includes the functional layer formation material that corresponds to the nozzles from ink jet heads on the anodes 3R and 3G that are divided by the bulkhead 31.

On the other hand, the second hole transport layer 43, the blue light emitting functional layer 5B, the electron transport layer 62, the electron injection layer 63, and the common cathode 8 are respectively formed using a gaseous phase process such as a vacuum deposition method.

Therefore, with the light emitting element 1R and 1G, the flow of carriers is controlled by the carrier selection layer 46 that includes the intermediate layer 61 and the second hole transport layer 43, and the red light emitting functional layer 5R and the green light emitting functional layer 5G can be made to selectively or dominantly emit light.

Furthermore, since the light emitting element 20B does not include the intermediate layer 61, the holes that are injected from the hole injection layer 41 of the anode 3B side are carried efficiently to the blue light emitting functional layer 5B by the second hole transport layer 43 without being blocked by the intermediate layer 61. Further, the electrons that are injected from the electron injection layer 63 of the common cathode 8 side is carried efficiently to the blue light emitting functional layer 5B by the electron transport layer 62. Therefore, fluorescent or phosphorescent light emission that is excited by the coupling of the holes and the electrons that are carried into the blue light emitting functional layer 5B is obtained.

Since the present embodiment has a configuration in which the intermediate layer 61 is provided on the light emitting elements 1R and 1G, compared to the first embodiment described above, the light emitting elements 1R, 1G, and 20B can be formed efficiently without wasting the electron injection material for forming the intermediate layer 61 or the organic material in which the electron injection material is dispersed.

Figure 5:
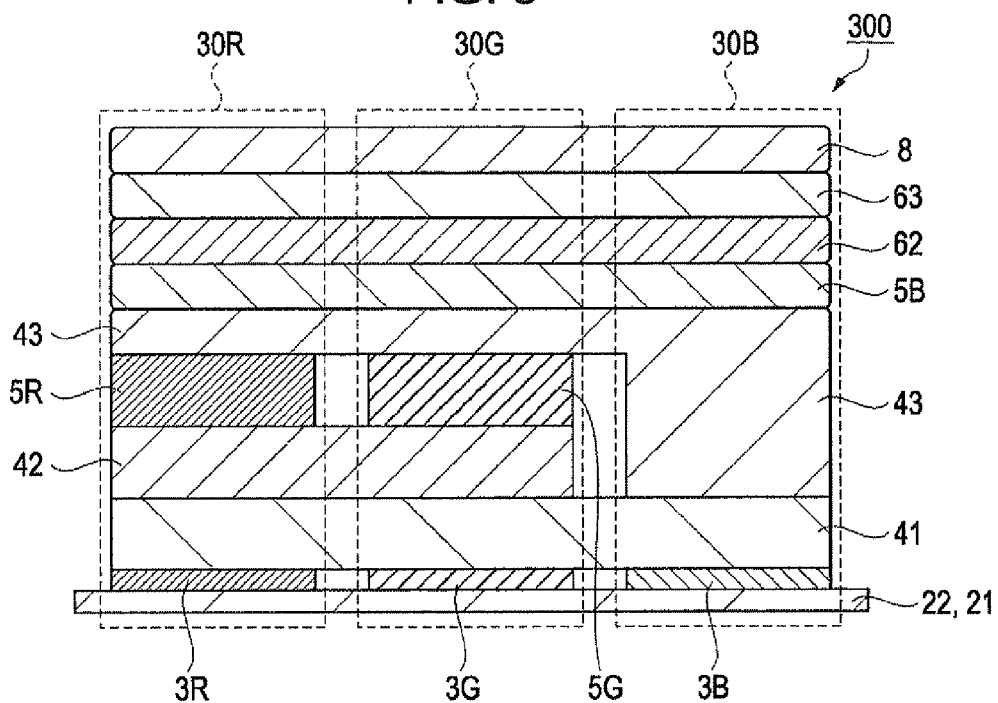
FIG. 5 is a schematic diagram that illustrates the configuration of light emitting elements of an organic EL device of Comparative example 1.
Figure 6:
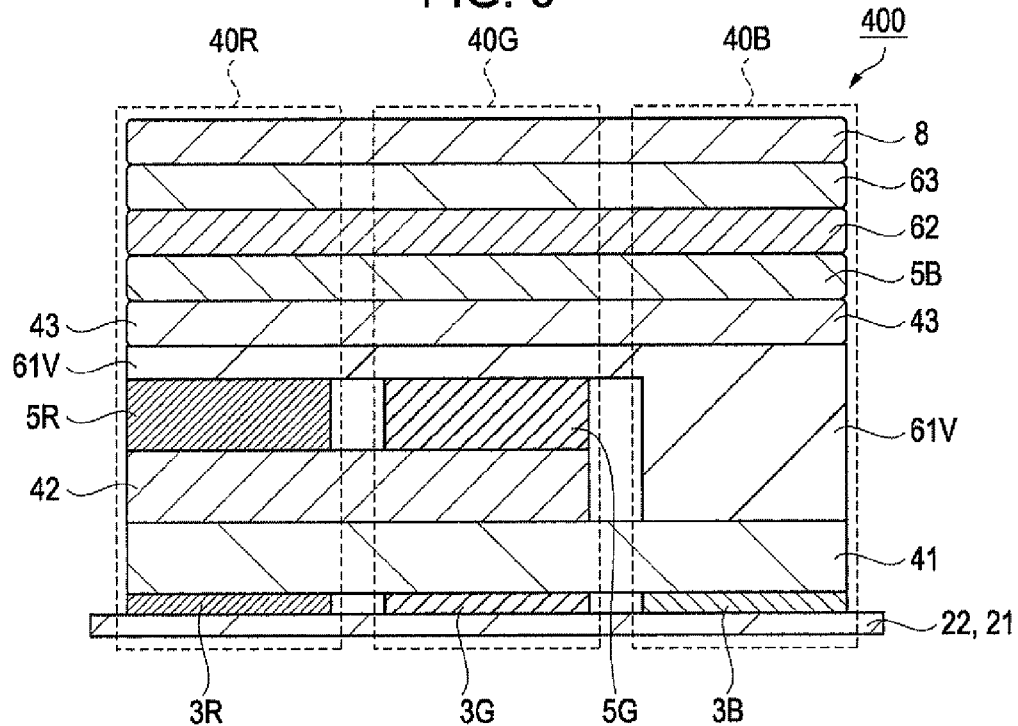
FIG. 6 is a schematic diagram that illustrates the configuration of light emitting elements of an organic EL device of Comparative example 2.

Next, specific examples of the invention will be described with reference to FIGS. 5 to 7. FIG. 5 is a schematic diagram that illustrates the configuration of light emitting elements of an organic EL device of Comparative example 1, FIG. 6 is a schematic diagram that illustrates the configuration of light emitting elements of an organic EL device of Comparative example 2, and FIG. 7 is a table that illustrates the overall evaluation results of the light emitting state and the element characteristics of the light emitting elements in the examples and comparative examples.

Here, the examples and comparative examples relate to an organic EL device with a large area, wherein the red light emitting element and the green light emitting element are formed by an ink jet method and the blue light emitting element is formed by a maskless vacuum deposition method in which there is no need for separation by application.

The same reference symbols are given to the same configurations as with the first embodiment described above for the examples and comparative examples, and detailed description will be omitted.

Example 1

Example 1 illustrates a specific example of the configuration and the manufacturing method of the light emitting elements 1R, 1G, and 1B of the organic EL device 100 of the first embodiment described above.

<1> First, a transparent glass substrate with an average thickness of 1.0 mm was prepared as the substrate 21. Next, ITO electrodes (anodes 3R, 3G, and 3B, individual electrodes) were formed after forming an ITO film with an average thickness of 50 nm on the substrate 21 by a sputtering method and patterning the ITO film by a photolithography method.

Furthermore, the substrate 21 on which the anodes 3R, 3G, and 3B are formed were dipped in order of acetone and 2-propanol, ultrasonically cleaned, and oxygen plasma processed.

<2> Next, the bulkhead (bank) 21 was formed by forming an insulating layer that is configured by an acrylic resin by a spin coating method on the substrate 21 on which the anodes 3R, 3G, and 3B are formed, before patterning the insulating layer using a photolithography method so that the ITO electrodes were exposed. Furthermore, the surface of the substrate 21 on which the bulkhead is formed was first plasma processed with $O_2$ gas as the processing gas. In so doing, the surfaces of the anodes 3R, 3G, and 3B and the surface of the bulkhead (including the wall surfaces) were activated and became lyophilic. Next, the surface of the substrate 21 on which the bulkhead is formed was plasma processes with $CF_4$ gas as the processing gas. In so doing, the $CF_4$ gas reacted only with the surface of the bulkhead composed of the acrylic resin and became liquid-repelling.

<3-1> Next, 1.0 wt % of a PEDOT/PSS aqueous dispersion was applied to the inside of the bulkhead that was positioned in a region in which the red light emitting element 1R was to be formed using an ink jet method.

<3-2> Next, 1.0 wt % of a PEDOT/PSS aqueous dispersion was applied to the inside of the bulkhead that was positioned in a region in which the green light emitting element 1G was to be formed using an ink jet method.

<3-3> Next, 1.0 wt % of a PEDOT/PSS aqueous dispersion was applied to the inside of the bulkhead that was positioned in a region in which the blue light emitting element 1B was to be formed using an ink jet method.

<3-4> Next, the ion-conductive hole injection layer 41 with an average thickness of 50 nm which was configured by PEDOT/PSS was respectively formed on each of the anodes 3R, 3G, and 3B by heating the substrate 21 in air after drying the PEDOT/PSS water dispersion that was applied in each of the processes described above.

<4-1> Next, 1.5 wt % of a tetramethylbenzene solution that is the compound represented by Chemical Formula 5 above was applied to the inside of the bulkhead that was positioned in a region in which the red light emitting element 1R was to be formed using an ink jet method.

<4-2> Next, 1.5 wt % of a tetramethylbenzene solution that is the compound represented by Chemical Formula 5 above was applied to the inside of the bulkhead that was positioned in a region in which the green light emitting element 1G was to be formed using an ink jet method.

<4-3> Next, after drying the tetramethylbenzene solution that is the compound represented by Chemical Formula 5 above, the substrate 21 was heated in an atmosphere of nitrogen. Furthermore, the region of the substrate 21 on which the red light emitting element 1R and the green light emitting element 1G were to be formed were rinsed with xylene. In so doing, the first hole transport layer 42 with an average thickness of 10 nm which is configured by the compound represented by Chemical Formula 5 above was respectively formed on each hole injection layer 41.

<5-1> Next, 1.2 wt % of a tetramethylbenzene solution that is the compound represented by Chemical Formula 6 above was applied to the inside of the bulkhead that was positioned in a region in which the red light emitting element 1R was to be formed using an ink jet method.

<5-2> Next, 1.2 wt % of a tetramethylbenzene solution that is the compound represented by Chemical Formula 19 above was applied to the inside of the bulkhead that was positioned in a region in which the green light emitting element 1G was to be formed using an ink jet method.

<5-3> Next, after drying the tetramethylbenzene solution that is the compound represented by Chemical Formula 6 above and the tetramethylbenzene solution that is the compound represented by Chemical Formula 19 above, the substrate 21 was heated in an atmosphere of nitrogen. In so doing, the red light emitting functional layer 5R with an average thickness of 60 nm which is configured by the compound represented by Chemical Formula 6 above and the green light emitting functional layer 5G with an average thickness of 60 nm which is configured by the compound represented by Chemical Formula 19 above were respectively formed on each first hole transport layer 42.

<6> Next, the intermediate layer 61 was created by forming an aqueous solution with 1 wt % of $Cs_2CO_3$ with respect to polyvinyl alcohol on the red light emitting functional layer 5R, the green light emitting functional layer 5G, and the hole injection layer 41 that were respectively positioned in the region in which the red light emitting element 1R was to be formed, the region in which the green light emitting element 1G was to be formed, and the region in which the blue light emitting element 1B was to be formed by a spin coating method to create films with an average thickness of 5 nm.

<7> Next, the second hole transport layer 43 with an average thickness of 10 nm which is configured by α-NPD was formed on the intermediate layer 61 using a vacuum deposition method.

<8> Next, the blue light emitting functional layer 5B with an average thickness of 20 nm which is configured by the blue light emitting functional layer formation material described below was formed on the second hole transport layer 43 using a vacuum deposition method.

Here, the compound represented by Chemical Formula 11 above was used as the host material and the compound represented by Chemical Formula 14 above was used as the guest material as the formation material of the blue light emitting functional layer 5B. Further, the content amount (doping concentration) of the guest material (dopant) within the blue light emitting functional layer 5B was 5.0% by weight with respect to the host material.

<9> Next, the electron transport layer 62 with an average thickness of 20 nm which is configured by tris(8-quinolinolato)aluminum ($ALq_3$) was formed on the blue light emitting functional layer 5B using a vacuum deposition method.

<10> Next, the electron injection layer 63 with an average thickness of 1 nm which is configured by lithium fluoride (LiF) was formed on the electron transport layer 62 using a vacuum deposition method.

<11> Next, the common cathode 8 with an average thickness of 100 nm which is configured by Al was formed on the electron injection layer 63 using a vacuum deposition method.

<12> Next, a glass protective cover (sealing member) was placed to cover each layer that was formed, and the protective cover was fixed and sealing with an epoxy resin.

The organic EL device 100 of a bottom emission structure as illustrated in FIG. 2 was manufactured by the processes described above.

Example 2

Example 2 illustrates a specific example of the configuration and the manufacturing method of the light emitting elements 1R, 1G, and 20B of the organic EL device 200 of the second embodiment.

The organic EL device 200 with the bottom emission structure as illustrated in FIG. 2 was manufactured similarly to Example 1 described above other than the processes 5-1 to 5-3, 6, 7, 8, and 9 of Example 1 described above respectively being changed to processes 5-1', 5-2', 5-3', 6', 7', 8', and 9' described below. The changed processes will be described below.

In 5-1', 1.2 wt % of a tetramethylbenzene solution that is the compound represented by Chemical Formula 7 above was applied to the inside of the bulkhead that was positioned in a region in which the red light emitting element 1R was to be formed using an ink jet method.

<5-2'> Next, 1.2 wt % of a tetramethylbenzene solution that is the compound represented by Chemical Formula 20 above was applied to the inside of the bulkhead that was positioned in a region in which the green light emitting element 1G was to be formed using an ink jet method.

5-3'> Next, after drying the tetramethylbenzene solution that is the compound represented by Chemical Formula 7 above and the tetramethylbenzene solution that is the compound represented by Chemical Formula 20 above, the substrate 21 was heated in an atmosphere of nitrogen. In so doing, the red light emitting functional layer 5R with an average thickness of 50 nm which is configured by the compound represented by Chemical Formula 7 above and the green light emitting functional layer 5G with an average thickness of 50 nm which is configured by the compound represented by Chemical Formula 20 above were respectively formed on each first hole transport layer 42.

<6'> Next, the intermediate layer 61 was created by selectively discharging and drying an aqueous solution with 1 wt % of $Cs_2CO_3$ with respect to polyvinyl alcohol on the red light emitting functional layer 5R and the green light emitting functional layer 5G that were respectively positioned in the region in which the red light emitting element 1R was to be formed and the region in which the green light emitting element 1G was to be formed by an ink jet method to create films with an average thickness of 5 nm.

<7'> Next, the second hole transport layer 43 with an average thickness of 10 nm which is configured by the compound represented by Chemical Formula 9 above was formed on the intermediate layer 61 and the hole injection layer 41 that were respectively positioned in the region in which the red light emitting element 1R was to be formed, the region in which the green light emitting element 1G was to be formed, and the region in which the blue light emitting functional layer 5B was to be formed using a vacuum deposition method.

<8'> Next, the blue light emitting functional layer 5B with an average thickness of 10 nm which is configured by the blue light emitting functional layer formation material described below was formed on the second hole transport layer 43 using a vacuum deposition method.

Here, the compound represented by Chemical Formula 13 above was used as the host material and the compound represented by Chemical Formula 15 above was used as the guest material as the formation material of the blue light emitting functional layer 5B. Further, the content amount (doping concentration) of the guest material (dopant) within the blue light emitting functional layer 5B was 5.0% by weight with respect to the host material.

<9'> Next, the electron transport layer 62 with an average thickness of 30 nm which is configured by the compound represented by Chemical Formula 17 above was formed on the blue light emitting functional layer 5B using a vacuum deposition method.

Comparative Example 1

As illustrated in FIG. 5, an organic EL device 300 of Comparative example 1 includes a light emitting element 30R that corresponds to red, a light emitting element 30G that corresponds to green, and a light emitting element 30B that corresponds to blue on the substrate 21.

Specifically, with the light emitting element 30R, the anode 3R, the hole injection layer 41, the first hole transport layer 42, the red light emitting functional layer 5R as the first layer, the second hole transport layer 43, the blue light emitting functional layer 5B as the second layer, the electron transport layer 62, the electron injection layer 63, and the common cathode 8 are laminated in such an order on the flattening layer 22.

With the light emitting element 30G, the anode 3G, the hole injection layer 41, the first file transport layer 42, the green light emitting functional layer 5G as the first layer, the second hole transport layer 43, the blue light emitting functional layer 5B as the second layer, the electron transport layer 62, the electron injection layer 63, and the common cathode 8 are laminated in such an order on the flattening layer 22.

With the light emitting element 30B, the anode 3B, the hole injection layer 41, the second hole transport layer 43, the blue light emitting functional layer 5B as the second layer 5B, the electron transport layer 62, the electron injection layer 63, and the common cathode 8 are laminated in such an order on the flattening layer 22.

The configuration and the manufacturing method of each functional layer is the same as Example 1 described above. That is, the configurations of each of the light emitting elements 30R, 30G, and 308 of the organic EL device 300 of Comparative example 1 are configurations in which the intermediate layer 61 is excluded from each of the light emitting elements 1R. 1G, and 1B from Example 1 described above.

Comparative Example 2

As illustrated in FIG. 6, an organic EL device 400 of Comparative example 2 includes a light emitting element 40R that corresponds to red, a light emitting element 40G that corresponds to green, and a light emitting element 40B that corresponds to blue on the substrate 21.

Specifically, with the light emitting element 40R, the anode 3R, the hole injection layer 41, the first hole transport layer 42, the red light emitting functional layer 5R as the first layer, an intermediate layer 61V, the second hole transport layer 43, the blue light emitting functional layer 5B as the second layer, the electron transport layer 62, the electron injection layer 63, and the common cathode 8 are laminated in such an order on the flattening layer 22.

With the light emitting element 40G, the anode 3G, the hole injection layer 41, the first hole transport layer 42, the green light emitting functional layer 5G as the first layer, the intermediate layer 61V, the second hole transport layer 43, the blue light emitting functional layer 5B as the second layer, the electron transport layer 62, the electron injection layer 63, and the common cathode 8 are laminated in such an order on the flattening layer 22.

With the light emitting element 40B, the anode 3B, the hole injection layer 41, the intermediate layer 61V, the second hole transport layer 43, the blue light emitting functional layer 5B as the second layer, the electron transport layer 62, the electron injection layer 63, and the common cathode 8 are laminated in such an order on the flattening layer 22.

The intermediate layer 61V is formed, for example, with $CS_2CO_3$ as the electron injection material by a vacuum deposition method so that the average thickness is 5 nm.

The configuration and the manufacturing method of each functional layer excluding the intermediate layer 61V is the same as Example 1 described above. That is, in the configuration of each light emitting element 40R, 40G, and 40B of the organic EL device 400 of Comparative example 2, the intermediate layer 61 composed of an organic material in which the electron injection material is dispersed according to each of the light emitting elements 1R, 1G, and 1B of Example 1 described above is replaced by the intermediate layer 61B composed of the electron injection material alone.

As illustrated in FIG. 7, with the red light emitting functional layer 5R and the green light emitting functional layer 5G as the first layer of the organic EL device 300 of Comparative example 1, since the second hole transport layer 43 that is formed between the first layer and the blue light emitting functional layer 5B as the second layer block the electrons that try to pass through the blue light emitting functional layer 5B and flow into the red light emitting functional layer 5R and the green light emitting functional layer 5G, the red light emitting functional layer 5R and the green light emitting functional layer 5G hardly emit light at all (X). On the other hand, since the blue light emitting functional layer 5B that is the second layer has no reason to obstruct the flow of holes or electrons that are the carriers, the blue light emitting functional layer 5B emits light (⊙). Therefore, as an overall evaluation of the element characteristics, since the light emitting elements 30R and 30G cannot be made to selectively or dominantly emit light with the respective desired colors, the light emitting elements 30R and 30G are X.

With the red light emitting functional layer 5R and the green light emitting functional layer 5G as the first layer of the organic EL device 400 of Comparative example 2, since the intermediate layer 61V composed of the electron injection material alone and the second hole transport layer 43 are formed between the blue light emitting functional layer 5B as the second layer and the first layer, the intermediate layer 61V and the second hole transport layer 43 function as the carrier selection layer similarly to Example 1 described above. It is therefore possible to cause the light emitting elements 40R, 40G, and 40B to emit light selectively or dominantly in the respective desired colors. However, if the intermediate layer 61V is formed by forming the electron injection material (In such a case, $CS_2CO_3$; cesium carbonate) using, for example, a vacuum deposition method as the gaseous phase process in the formation process of the intermediate layer 61V, agglomeration of the electron injection material tends to occur, and sufficient carrier control functions are not obtained from the formed intermediate layer 61V. That is, since the electron injection material from the intermediate layer 61V is dispersed in the second hole transport layer 43 and the electron blocking function cannot be sufficiently decreased, and high color purity light emission is not obtained as the blue light emitting functional layer 5B also emits little light as with the light emission from the red light emitting functional layer 5R and the green light emitting functional layer 5G, which is Δ. Further, since it is considered that in addition to the problem of the color purity, since the degree of agglomeration of the electron injection material in the intermediate layer 61V also influences the light emitting life, the overall evaluation of the element characteristics is also Δ.

As opposed to Comparative examples 1 and 2, in Examples 1 and 2, the red light emitting functional layer 5R, the green light emitting functional layer 5G, and the blue light emitting functional layer 5B all selectively or dominantly emit light (○, ⊙). In particular, since in Example 2, the intermediate layer 61 with the desired thickness is formed by discharging the necessary amount of solution for each of the light emitting elements 1R and 1G using an ink jet method compared to Example 1 in which the intermediate layer 61 is formed by a liquid phase process across each of the light emitting elements on the display region E (FIG. 1.), Example 2 is excellent in that stable light emitting characteristics are obtained (⊙). The Overall evaluation of the element characteristics is also excellent in that a stable light emitting life is obtained (⊙).

Third Embodiment

Electronic Apparatus

Next, an electronic apparatus of the present embodiment will be described with reference to FIGS. 8 to 10.

The organic EL device 100 and 200 of the embodiments described above can be built into various electronic apparatuses.

Figure 8:
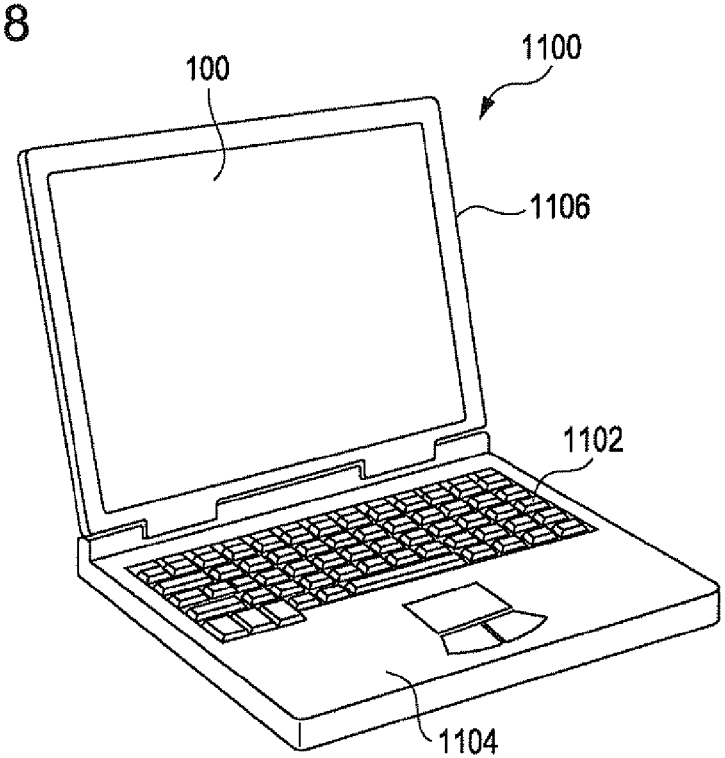
FIG. 8 is a perspective diagram that illustrates a mobile personal computer as an example of an electronic apparatus.

FIG. 8 is a schematic diagram that illustrates a mobile (or notebook) personal computer as an example of the electronic apparatus.

As illustrated in FIG. 8, a personal computer 1100 as the electronic apparatus is configured by a main body portion 1104 that includes a keyboard 1102 and a display unit 1106 that includes a display portion, and the display unit 1106 is supported to be rotatable with respect to the main body portion 1104 via a hinge structure portion.

With the personal computer 1100, the display portion that the display unit 1106 includes is configured by the organic EL device 100 (or organic EL device 200) described above.

Figure 9:
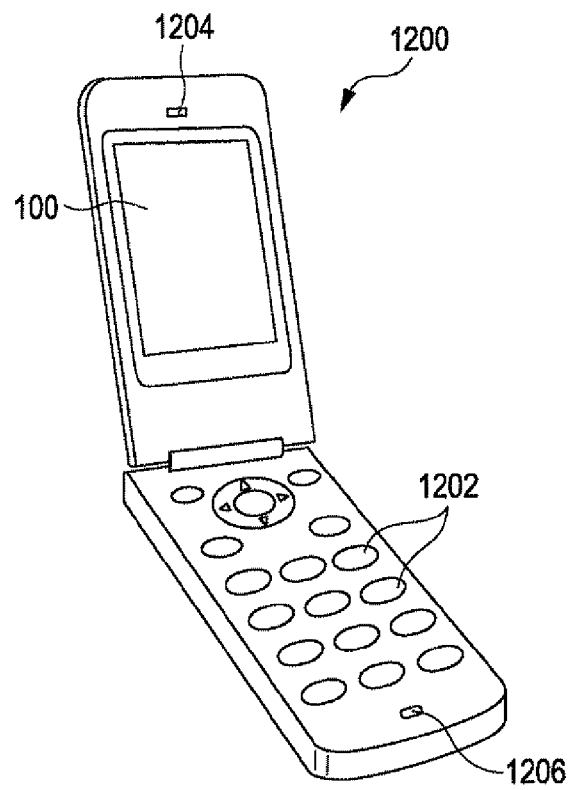
FIG. 9 is a perspective diagram that illustrates a mobile phone as an example of the electronic apparatus.

FIG. 9 is a schematic diagram that illustrates a mobile phone (including a PHS) as an example of the electronic apparatus.

As illustrated in FIG. 9, a mobile phone 1200 as the electronic apparatus includes a plurality of operation buttons 1202, an earpiece 1204, a mouthpiece 1206, and a display unit.

With the mobile phone 1200, the display unit is configured by the organic EL device 100 (or the organic EL device 200) described above.

Figure 10:
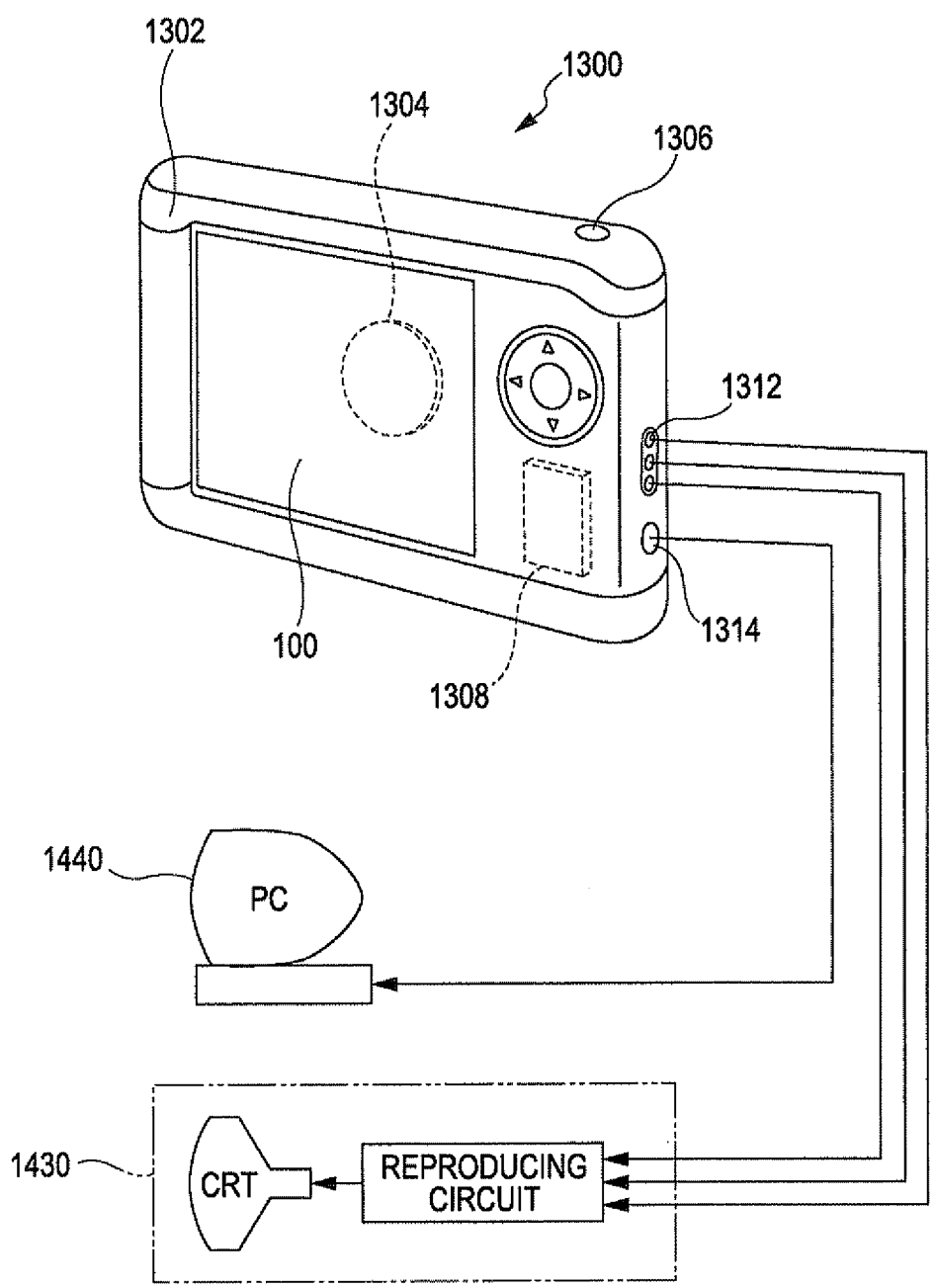
FIG. 10 is a perspective diagram that illustrates a digital still camera as an example of the electronic apparatus.

FIG. 10 is a schematic diagram that illustrates a digital still camera as an example of the electronic apparatus. Here, the connection with an external apparatus is also illustrated in a simplified manner in the drawing.

Here, while an ordinary camera exposes a silver halide photographic film by the optical image of the subject, a digital camera 1300 as the electronic apparatus generates an imaging signal (image signal) by photoelectrically converting the optical image of the subject by an imaging element such as a CCD (Charge Coupled Device).

As illustrated in FIG. 10, the digital still camera 1300 has a configuration in which a display unit is provided on the back face of a case (body) 1302 of the digital still camera 1300 and a display is performed based on the imaging signals by a CCD, and the display unit functions as a finder that displays the subject as an electronic image.

With the digital still camera 1300, the display unit is configured by the organic EL device 100 (or the organic EL device 200) described above.

A circuit substrate 1308 is installed on the inside of the case. A memory that can store imaging signals is installed in the circuit substrate 1308.

Further, a light receiving unit 1304 that includes an optical lens (imaging optical system), a CCD, and the like is provided on the front side of the case 1302 (back face side in the configuration shown in the drawing).

When the photographer verifies the subject image that is displayed on the display unit and presses a shutter button 1306, the imaging signal of the CCD at that time is transferred and stored in the memory of the circuit substrate 1308.

Further, with the digital still camera 1300, a video signal output terminal 1312 and an input output terminal 1314 for data communication are provided on a side face of the case 1302. Furthermore, as shown in the drawing, a television monitor 1430 and a personal computer 1440 are respectively connected to the video signal output terminal 1312 and the input output terminal 1314 for data communication as necessary. Furthermore, the digital still camera 1300 has a configuration in which the imaging signals that are stored in the memory of the circuit substrate 1308 are output to the television monitor 1430 or the personal computer 1440 by a predetermined operation.

Here, other than the personal computer (mobile personal computer) 1100, the mobile phone 1200, and the digital still camera 1300, the electronic apparatus to which the organic EL device 100 (or the organic EL device 200) of the embodiment described above is applied, the organic EL device 100 may be applied, for example, to a television, a video camera, a viewfinder type or monitor direct view type video tape recorder, a laptop personal computer, a car navigation device, a pager, an electronic notebook (include those with communication functions), an electronic dictionary, a calculator, an electronic game console, a word processor, a workstation, a television phone, a security television monitor, electronic binoculars, a POS terminal, an apparatus that includes a touch panel (for example, a cash dispenser of a financial institution, a vending machine), a medical apparatus (for example, an electronic thermometer, a blood pressure meter, a blood sugar meter, an electrocardiographic display device, an ultrasonic diagnostic device, an endoscope display device), a fish finder, various measurement apparatuses, meters (for examples, meters for rolling stock, aircraft, and ships), a flight simulator, various other monitors, and a projection type display device such as a projector.

While the organic EL device, the manufacturing method thereof, and the electronic apparatus of the invention have been described above based on the embodiments shown in the drawings, the invention is not limited thereto.

For example, while the organic EL device 100 includes the red light emitting element 1R and the green light emitting element 1G as light emitting elements that emit light of longer wavelengths than blue, without being limited thereto, the organic EL device 100 may include light emitting elements that emit light with longer wavelengths than yellow such as a yellow light emitting element or an orange light emitting element. In such a case, the configuration of the organic EL device of the invention is applied to such a yellow light emitting element and an orange light emitting element.

The entire disclosure of Japanese Patent Application No. 2011-091801, filed Apr. 18, 2011 is expressly incorporated by reference herein.

What is claimed is:

1. A manufacturing method of an organic EL device, the method comprising:
   respectively forming a first hole transport layer on a first anode and a second anode;
   forming a first layer that includes a function of emitting light of a first color on the first hole transport layer of the first anode side using a liquid phase process;
   forming a third layer composed of an organic material in which an electron injection material is dispersed on the first layer using a liquid phase process;
   forming a second layer that includes a function of emitting light of a second color on the third layer and on the first hole transport layer of the second anode side using a maskless gas phase process; and
   forming a common cathode on the second layer, wherein the third layer is formed between the first layer and the second layer.

2. The manufacturing method of the organic EL device according to claim 1, further comprising:
   forming a second hole transport layer between the third layer and the second layer.

3. The manufacturing method of the organic EL device according to claim 1,
   wherein the electron injection material is configured by an alkali metal, an alkaline earth metal, or a compound thereof.

4. The manufacturing method of the organic EL device according to claim 1,
   wherein the organic material is a water-soluble high-molecular compound.

5. The manufacturing method of the organic EL device according to claim 1,
   wherein the organic material is a water-soluble low-molecular compound.

6. A manufacturing method of an organic EL device, the method comprising:
   respectively forming a first hole transport layer on a first anode and a second anode;
   forming a first layer that includes a function of emitting light of a first color on the first hole transport layer of the first anode side using a liquid phase process;
   forming a third layer composed of an organic material in which an electron injection material is dispersed on the first layer and the first hole transport layer of the second anode side using a liquid phase process;
   forming a second layer that includes a function of emitting light of a second color on the third layer using a maskless gas phase process; and
   forming a common cathode on the second layer, wherein the third layer is formed between the first layer and the second layer.

* * * * *